United States Patent
Tanaka et al.

(10) Patent No.: US 8,222,126 B2
(45) Date of Patent: Jul. 17, 2012

(54) LASER IRRADIATION APPARATUS AND METHOD FOR MANUFACTURING SEMICONDUCTOR DEVICE

(75) Inventors: Koichiro Tanaka, Kanagawa (JP); Yoshiaki Yamamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/852,636

(22) Filed: Aug. 9, 2010

(65) Prior Publication Data

US 2010/0323504 A1    Dec. 23, 2010

Related U.S. Application Data

(62) Division of application No. 11/101,481, filed on Apr. 8, 2005.

(30) Foreign Application Priority Data

Apr. 23, 2004    (JP) ................... 2004-127468

(51) Int. Cl.
*H01L 21/02* (2006.01)

(52) U.S. Cl. ..................... 438/487; 438/795; 219/121.6; 369/119

(58) Field of Classification Search .. 219/121.6–121.86; 438/487, 471, 795, 308, 676; 369/119, 145
See application file for complete search history.

(56) References Cited

U.S. PATENT DOCUMENTS

| | | | |
|---|---|---|---|
| 4,734,550 A | 3/1988 | Imamura et al. | |
| 4,978,970 A | 12/1990 | Okazaki | |
| 5,591,668 A * | 1/1997 | Maegawa et al. | 438/799 |
| 5,612,251 A * | 3/1997 | Lee | 438/795 |
| 5,643,826 A | 7/1997 | Ohtani et al. | |
| 5,790,620 A | 8/1998 | Okazaki et al. | |
| 5,923,962 A | 7/1999 | Ohtani et al. | |
| 5,932,120 A * | 8/1999 | Mannava et al. | 219/121.85 |
| 6,066,516 A | 5/2000 | Miyasaka | |
| 6,084,202 A * | 7/2000 | Okazaki et al. | 219/121.61 |
| 6,285,042 B1 | 9/2001 | Ohtani et al. | |
| 6,307,799 B1 * | 10/2001 | Ngoi et al. | 365/215 |

(Continued)

FOREIGN PATENT DOCUMENTS

EP    0 651 431 A2    5/1995

(Continued)

OTHER PUBLICATIONS

Hatano et al., "In-situ Observation of Laser-induced Melting and Resolidification Dynamics of Si Thin Films," Surface Science vol. 24, No. 6, pp. 375-382, 2003.

(Continued)

*Primary Examiner* — Thomas Alunkal

(74) *Attorney, Agent, or Firm* — Nixon Peabody LLP; Jeffrey L. Costellia

(57) ABSTRACT

It is an object of the present invention to provide a laser irradiation apparatus being able to irradiate the irradiation object with the laser beam having homogeneous energy density without complicating the optical system. The laser irradiation apparatus of the present invention comprises a laser oscillator, an optical system for scanning repeatedly a beam spot of the laser beam emitted from the laser oscillator in a uniaxial direction over the surface of the irradiation object, and a position controlling means for moving the position of the irradiation object relative to the laser beam in a direction perpendicular to the uniaxial direction.

7 Claims, 14 Drawing Sheets

U.S. PATENT DOCUMENTS

| | | | |
|---|---|---|---|
| 6,335,509 B1 | 1/2002 | Jung | |
| 6,335,541 B1 | 1/2002 | Ohtani et al. | |
| 6,437,284 B1 | 8/2002 | Okamoto et al. | |
| 6,455,360 B1 | 9/2002 | Miyasaka | |
| 6,570,125 B2 | 5/2003 | Suh et al. | |
| 6,653,179 B1* | 11/2003 | Minegishi et al. | 438/166 |
| 6,746,903 B2 | 6/2004 | Miyasaka | |
| 6,849,825 B2 | 2/2005 | Tanaka | |
| 7,919,726 B2* | 4/2011 | Tanaka | 219/121.76 |
| 2002/0043691 A1* | 4/2002 | Higashi et al. | 257/368 |
| 2002/0053670 A1 | 5/2002 | Ohtani et al. | |
| 2002/0146868 A1 | 10/2002 | Miyasaka | |
| 2003/0166315 A1* | 9/2003 | Tanada et al. | 438/166 |
| 2004/0058513 A1* | 3/2004 | Murrell et al. | 438/535 |
| 2004/0065643 A1* | 4/2004 | Tanaka | 219/121.8 |
| 2004/0074881 A1* | 4/2004 | Oishi | 219/121.63 |
| 2004/0136416 A1 | 7/2004 | Tanaka | |
| 2005/0221569 A1* | 10/2005 | Nakata | 438/308 |

FOREIGN PATENT DOCUMENTS

| | | |
|---|---|---|
| EP | 0 724 929 A2 | 8/1996 |
| EP | 0 933 438 A1 | 8/1999 |
| EP | 1 158 580 A2 | 11/2001 |
| JP | 58-162032 | 9/1983 |
| JP | 01-246819 | 10/1989 |
| JP | 03-268318 | 11/1991 |
| JP | 04-061319 | 2/1992 |
| JP | 04-282869 | 10/1992 |
| JP | 05-315278 | 11/1993 |
| JP | 07-183540 | 7/1995 |
| JP | 08-206869 | 8/1996 |
| JP | 11-254156 | 9/1999 |
| JP | 2003-243321 | 8/2003 |
| KR | 10-0274293 | 1/2001 |

OTHER PUBLICATIONS

Hara et al., "Ultra-high Performance Poly-Si TFTs on Glass by a Stable Scanning CW Laser Lateral Crystallization," AM-LCD '01 Digest, pp. 227-230, 2001.

Korean Office Action (Application No. 2005-0032258; KR07845), dated Jul. 27, 2011.

* cited by examiner

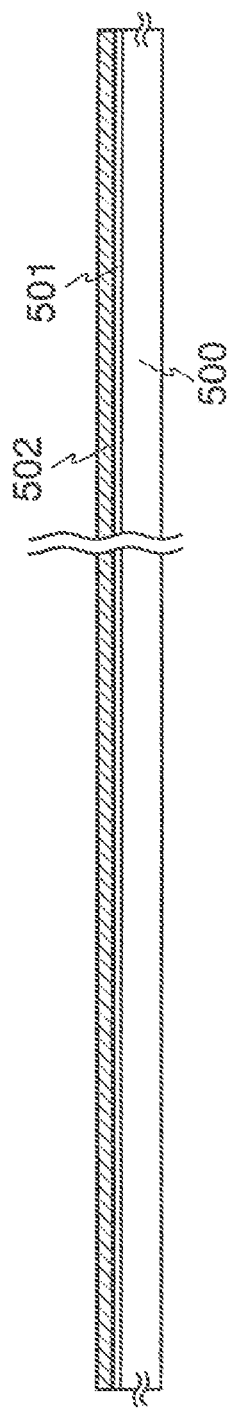
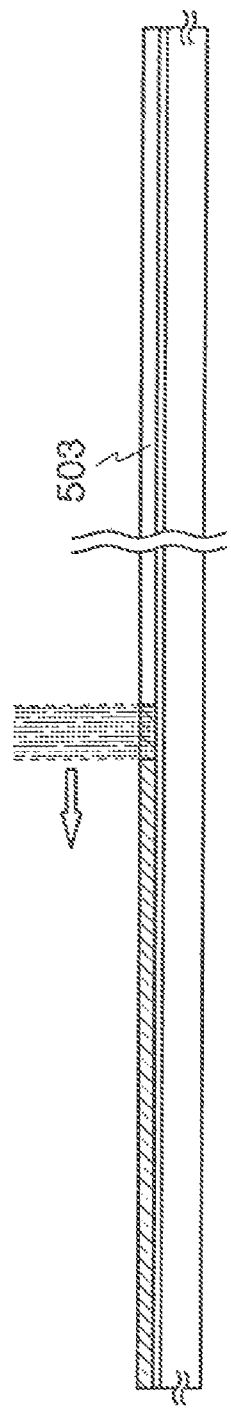
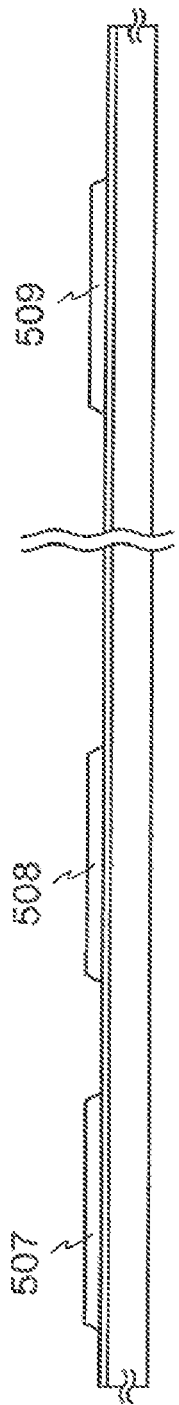
FIG. 7A
FIG. 7B
FIG. 7C

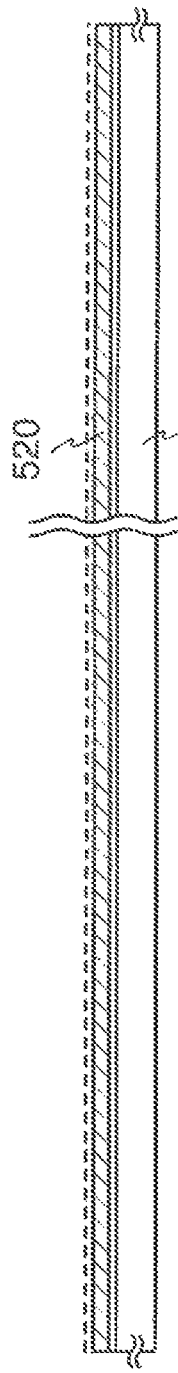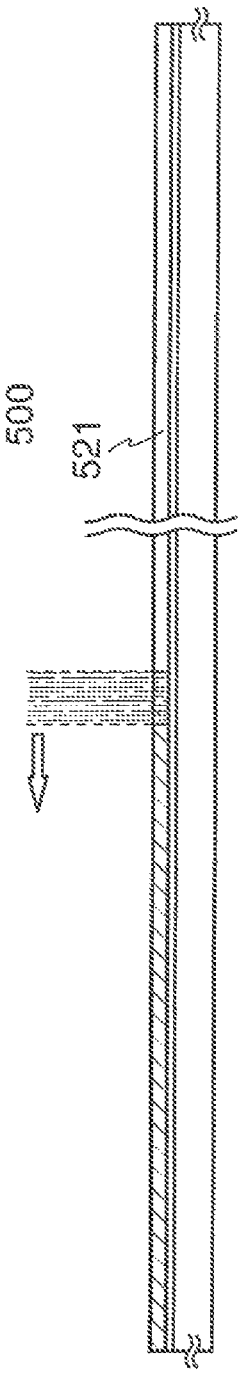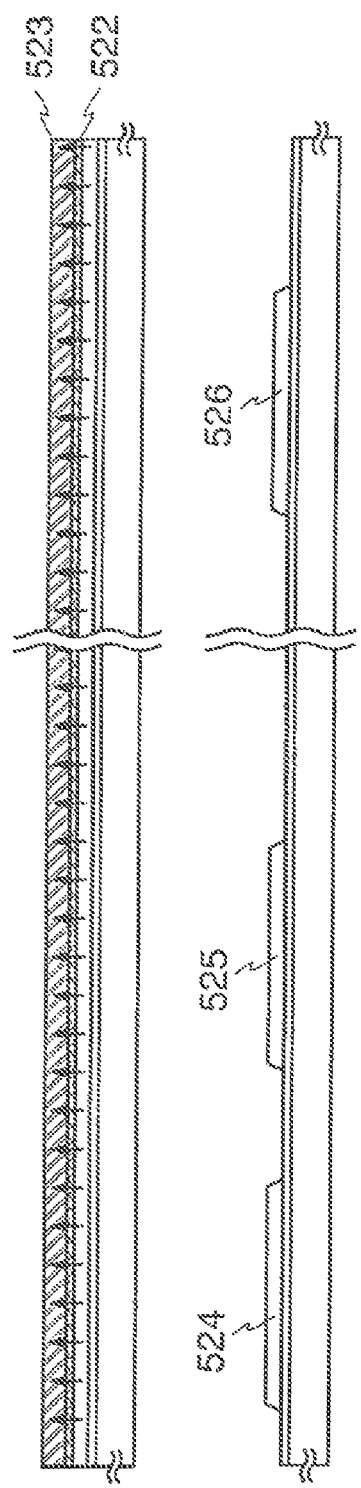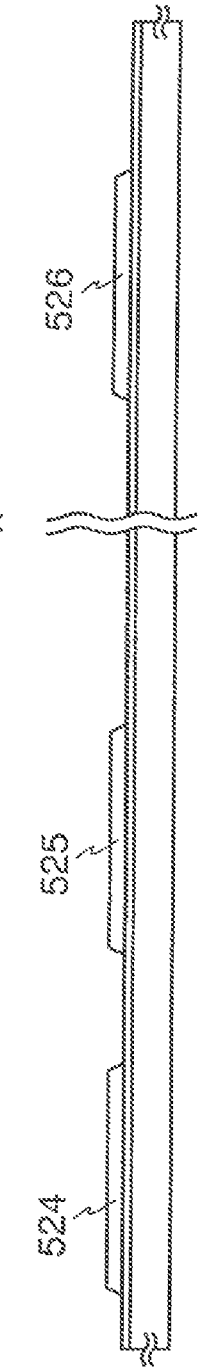
FIG. 8A
FIG. 8B
FIG. 8C
FIG. 8D

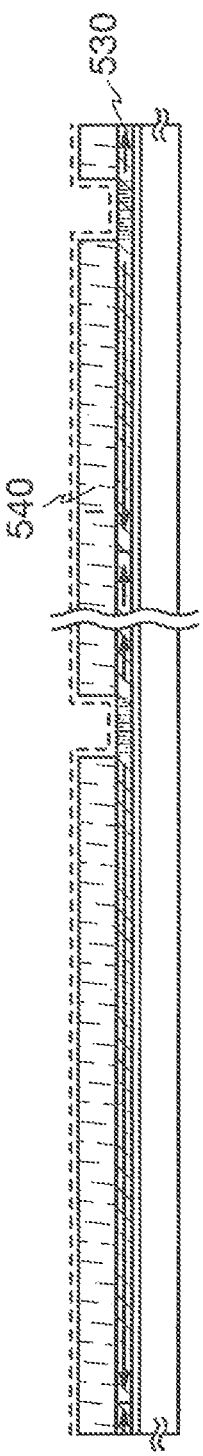
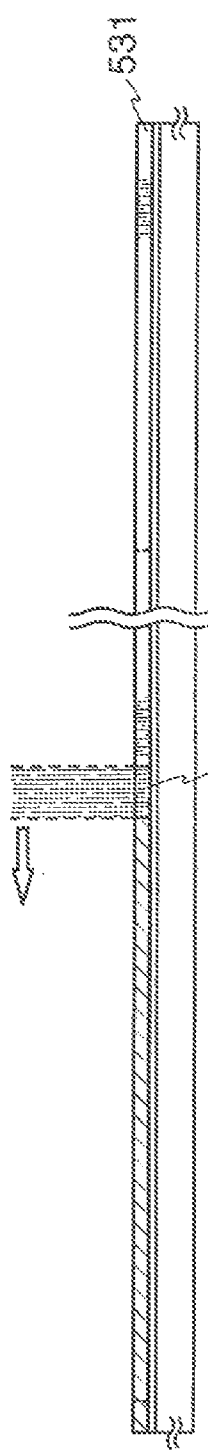
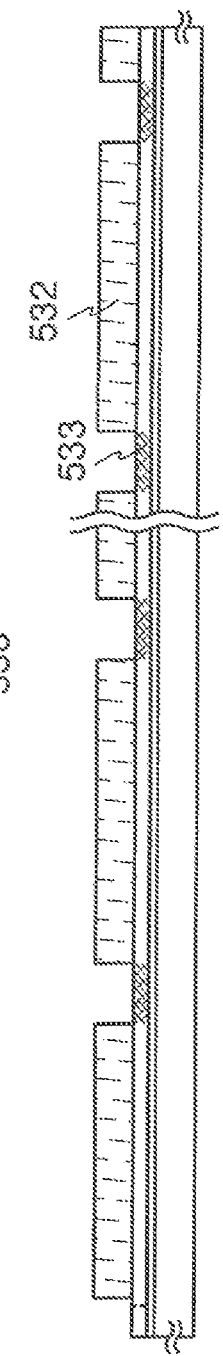
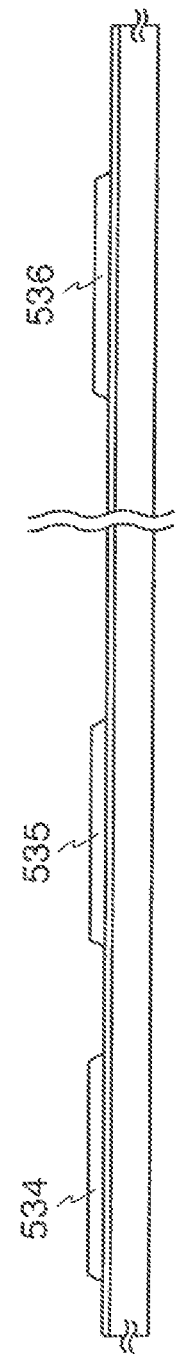
FIG. 9A
FIG. 9B
FIG. 9C
FIG. 9D

LASER IRRADIATION APPARATUS AND METHOD FOR MANUFACTURING SEMICONDUCTOR DEVICE

BACKGROUND OF THE INVENTION

1. Field of the Invention

The present invention relates to a laser irradiation apparatus used for crystallizing a semiconductor film. Moreover, the present invention relates to a method for manufacturing a semiconductor device.

2. Related Art

A thin film transistor (TFT) formed using a poly-crystalline semiconductor film is higher in mobility by double digits or more than a TFT formed using an amorphous semiconductor film, and has an advantage that a pixel portion and a peripheral driver circuit in a semiconductor display device can be integrally formed over the same substrate. The polycrystalline semiconductor film can be formed over an inexpensive glass substrate by employing a laser annealing method.

As laser oscillators used in the laser annealing method, there are a pulsed laser oscillator and a continuous wave laser oscillator according to the oscillation method. The pulsed laser oscillator typified by an excimer laser has output power per unit time which is approximately 3 to 6 digits higher than that of the continuous wave laser oscillator. Therefore, the throughput of the laser irradiation can be increased by shaping a beam spot (an irradiation region irradiated with the laser beam in fact on the surface of the irradiation object) into a rectangular spot having a length of several cm on a side or a linear spot having a length of 100, mm or more with the use of an optical system. For this reason, the pulsed laser oscillator has been mainly employed for crystallizing the semiconductor film.

It is noted that a term of "linear" herein used does not mean a line in a strict sense but means a rectangle (or long ellipse) having a large aspect ratio. For example, a rectangular beam having an aspect ratio of 2 or more (preferably 10 to 10000) is referred to as a linear beam. It is to be noted that the linear is included in the rectangular.

The semiconductor film crystallized thus by the pulsed laser beam includes plenty of crystal grains whose positions and sizes are random. Unlike the inside of the crystal grain, an interface between the crystal grains (a crystal grain boundary) includes an infinite number of trapping centers and recombination centers due to the crystal defect or the amorphous structure. When the carrier is trapped in the trapping center, the potential of the crystal grain boundary increases and becomes a barrier against the carrier; therefore, the transporting property of the carrier decreases.

In view of the above problem, a technique relating to the crystallization of the semiconductor film with the use of the continuous wave laser has attracted attention recently. In the case of the continuous wave laser, unlike the conventional pulsed laser, when the laser beam is scanned in one direction to irradiate the semiconductor film, it is possible to grow a crystal continuously in the scanning direction and to form an aggregation of crystal grains including a single crystal extending long in the scanning direction.

To increase the throughput of the laser annealing, it is necessary to shape the continuous wave laser beam into linear by an optical system. The important point in shaping the laser beam is the homogeneity of the energy density distribution of the beam spot in a major-axis direction (also referred to as a long-side direction). The energy density distribution in the major-axis direction affects the crystallinity of the semiconductor film crystallized by the laser annealing, and moreover affects the characteristic of a semiconductor element formed using the semiconductor film crystallized thus. For example, when the beam spot has Gaussian energy density distribution in the major-axis direction, the characteristic of the semiconductor element formed using such a beam spot also varies so as to have the Gaussian distribution. Therefore, in order to secure the homogeneity of the characteristic of the semiconductor element, it is desirable to homogenize the energy density distribution of the beam spot in the major-axis direction. The beam spot having homogeneous energy density distribution in the major-axis direction has an advantage of high throughput because the beam spot can be made longer in the major-axis direction.

To homogenize the energy density of the linear beam spot in the major-axis direction, it is necessary to use an optical element such as a cylindrical lens or a diffractive optical element. However, these optical elements for homogenizing the energy density have a problem in that the adjustment is complicate because they require advanced optical design in consideration of a wavefront and a shape of the beam spot.

Moreover, the semiconductor film can be crystallized more effectively when the absorption coefficient of the laser beam to the semiconductor film is higher. In the case of a YAG laser or a $YVO_4$ laser, the second harmonic has higher absorption coefficient than the fundamental wave to a silicon film having a thickness of several tens to several hundred nm, which is usually used in a semiconductor device. Therefore, usually, the harmonic having shorter wavelength than the fundamental wave is used in the laser crystallization for manufacturing a semiconductor device, and the fundamental wave is hardly used. The harmonic can be obtained by converting the fundamental wave by the non-linear optical element.

However, the continuous wave laser has lower output power per unit time than the pulsed laser. Therefore, the density of photon to time is also low, and the conversion efficiency into the harmonic by the non-linear optical element is also low. Specifically, in contrast with the pulsed laser having a conversion efficiency of approximately 10 to 30% the continuous wave laser has the conversion efficiency of approximately 0.2 to 0.3%. The continuous wave laser has another problem in that the resistance of the non-linear optical element is much lower than that in the pulsed laser because the continuous wave laser continuously gives burden to the non-linear optical element.

Therefore, a laser beam having the harmonic emitted from the continuous wave laser per unit time has low power, and it is difficult to increase the throughput by enlarging the area of the beam spot, compared with the pulsed laser beam. For example, a continuous wave YAG laser can provide the fundamental wave with an output power as high as 10 kW but provide the second harmonic with output power as low as 10 W. In this case, the area of the beam spot must be narrowed as small as $10^{-3}$ $mm^2$ in order to obtain the energy density required to crystallize the semiconductor film. As thus described, the continuous wave laser is inferior to the pulsed excimer laser in throughput, and this is one factor to decrease the economical efficiency in mass production.

SUMMARY OF THE INVENTION

In view of the above problems, it is an object of the present invention to provide a laser irradiation apparatus which can irradiate an irradiation object with a linear beam spot having homogeneous energy density in the major-axis direction without complicating the optical system. It is another object of the present invention to provide a laser irradiation apparatus which can grow continuously the crystal grain toward a direction perpendicular to a major axis of the linear beam spot. It is another object of the present invention to provide a laser irradiation apparatus which can increase the throughput of the laser irradiation to the irradiation object.

In view of the above problems, it is an object of the present invention to provide a method for manufacturing a semiconductor device which can irradiate a semiconductor film with a linear beam spot having homogeneous energy density in the major-axis direction without complicating the optical system. It is another object of the present invention to provide a laser irradiation apparatus which can grow continuously the crystal grain toward a direction perpendicular to a major axis of the linear beam spot. It is another object of the present invention to provide a method for manufacturing a semiconductor device which can increase the throughput of the laser irradiation to the semiconductor film.

According to one feature of the present invention, a laser beam emitted from a laser oscillator is scanned with high speed in a uniaxial direction by an optical system so as to form a quasi-linear beam spot. In this specification, the quasi-linear beam spot is a beam spot formed by scanning the laser beam along a line connecting a first point and a second point. More specifically, the quasi-linear beam spot is a beam spot formed by scanning a laser beam on the second point before a region melted by irradiating the first point with the laser beam is solidified. Therefore, the region irradiated with the quasi-linear beam is melted for a predetermined period as if it is irradiated with the linear beam.

The laser beam is scanned by the optical system or the moving means for moving a position of the irradiation object relative to the optical system and the laser beam so that the laser beam is scanned along each of plural straight lines arranging at uniform intervals. A first quasi-linear beam spot and a second quasi-linear beam spot which are formed by scanning the laser beam along the adjacent straight lines among the plural straight lines overlap partially each other in a direction perpendicular to the major axes of the quasi-linear beam spots. Moreover, the second quasi-linear beam spot is formed by scanning the laser beam before the part of the irradiation object irradiated with the first quasi-linear beam spot is solidified. Accordingly, the crystal grain in the irradiation object can be extended in the direction perpendicular to the major axis of the quasi-linear beam.

The present invention discloses a laser irradiation apparatus comprising a laser oscillator, an optical system for forming a quasi-linear beam spot by scanning a laser beam emitted from the laser oscillator so as to move back and forth along a straight line, and moving means for moving a position of an irradiation object relative to the laser beam in a direction perpendicular to the major axis of the quasi-linear beam spot. In this laser irradiation apparatus, the irradiation object is moved by the moving means so that a first irradiation region, which is irradiated with the quasi-linear beam spot, overlaps partially a second irradiation region, which is irradiated with the quasi-linear beam spot after the first irradiation region is irradiated. Moreover, in this laser irradiation apparatus, before the first irradiation region melted by the quasi-linear laser beam is solidified by absorbing a laser beam delivered to a part of the quasi-linear beam spot, the irradiation position of the quasi-linear beam spot is moved by the moving means from the first irradiation region to the second irradiation region.

The present invention discloses a laser irradiation apparatus comprising a laser oscillator, an optical system for scanning a laser beam emitted from the laser oscillator so as to move back and forth along a straight line, and moving means for moving a position of an irradiation object relative to the laser beam in a direction perpendicular to the scanning direction of the laser beam. In this laser irradiation apparatus, the laser beam is scanned along a wave-like line or a saw-like line on the irradiation object. When the laser beam is scanned along the wave-like line or the saw-like line from a first direction-turning point to a third direction-turning point through the second direction-turning point, a first beam spot formed by irradiating the first direction-turning point with the laser beam overlaps partially a second beam spot formed by irradiating the third direction-turning point with the laser beam. Moreover, the laser beam is scanned from the first direction-turning point to the third direction-turning point before the part of the irradiation object irradiated with the first beam spot is solidified.

The present invention discloses another laser irradiation apparatus comprising a laser oscillator and an optical system for scanning a laser beam emitted from the laser oscillator along each of plural straight lines arranging at uniform intervals. In this laser irradiation apparatus, a first quasi-linear beam spot formed by scanning the laser beam along a first straight line among the straight lines overlaps partially a second quasi-linear beam spot formed by scanning the laser beam along a second straight line adjacent to the first straight line. Moreover, the second quasi-linear beam spot is formed by scanning the laser beam before the part of the irradiation region irradiated with the first quasi-linear beam spot is solidified.

The present invention discloses another laser irradiation apparatus comprising a laser oscillator and an optical system for scanning a laser beam emitted from a laser oscillator along a wave-like line or a saw-like line. In this laser irradiation apparatus, when the laser beam is scanned along the wave-like line or the saw-like line from a first direction-turning point to a third direction-turning point through a second direction-turning point, a first beam spot centering on the first direction-turning point overlaps partially a second beam spot centering on the third direction-turning point. Moreover, the laser beam is scanned from the first direction-turning point to the third direction-turning point before the part of the irradiation object irradiated with the first beam spot is solidified.

The present invention discloses a method for manufacturing a semiconductor device wherein the laser beam is scanned on the semiconductor film along plural straight lines arranging at uniform intervals, wherein a first quasi-linear beam spot formed by scanning the laser beam along a first straight line among the straight lines overlaps partially a second quasi-linear beam spot formed by scanning the laser beam along a second straight line adjacent to the first straight line, and wherein the second quasi-linear beam spot is formed by scanning the laser beam before the part of the semiconductor film irradiated with the first quasi-linear beam spot is solidified.

The present invention discloses another method for manufacturing a semiconductor device wherein a laser beam is scanned along a wave-like line or a saw-like line, wherein when the laser beam is scanned along the wave-like line or the saw-like line from a first direction-turning point to a third direction-turning point through a second direction-turning point, a first beam spot centering on the first direction-turning point overlaps partially a second beam spot centering on the third direction-turning point, and wherein the second beam spot is formed before the part of the semiconductor film irradiated with the first beam spot is solidified.

The present invention discloses another method for manufacturing a semiconductor device wherein a laser beam is scanned on the semiconductor film along a comb-like line, wherein when the laser beam is scanned along the comb-like line from a first angle to a fourth angle through second and third angles, a first beam spot centering on the first angle overlaps partially a second beam spot centering on the fourth angle, and wherein the second beam spot is formed before the part of the semiconductor film irradiated with the first beam spot is solidified.

By using the laser irradiation apparatus or the method for manufacturing a semiconductor device as described above, the interface between the solid phase and the liquid phase can be moved in the irradiation object continuously in one direction.

For example, in the case of the continuous wave laser beam, it takes approximately 100 ns after the semiconductor film is melted by the laser irradiation and before the semiconductor film is solidified completely according to the nonpatent document 1. In this case, the quasi-linear beam spot may be formed by setting the repetition frequency of the laser beam to 10 MHz or more. With the above structure, the interface between the solid phase and the liquid phase can be moved continuously in the direction perpendicular to the major axis of the quasi-linear beam spot when before a region in the semiconductor film melted by the quasi-linear beam spot is solidified, the next quasi-linear laser beam is delivered to a region overlapping partially the melted region in the semiconductor film. Then, as a result of moving the interface between the solid phase and the liquid phase continuously, it is possible to form an aggregation of crystal grains each having a width of 10 to 30 μm in a direction perpendicular to the major axis of the quasi-linear beam spot and a width of 1 to 5 μm in the major-axis direction. By forming the crystal grain of the single crystal extending long in the direction perpendicular to the major axis of the quasi-linear beam spot, it is possible to form the TH having almost no crystal grain boundaries which intersect the direction where the carrier moves.

[Nonpatent Document 1] Surface Science Vol. 24 No. 6 pp. 375-382, 2003

The upper limit of the pulse repetition frequency of the laser beam in the uniaxial direction to form the quasi-linear beam spot may be determined so that the total energy of the laser beam delivered to any one point can melt the semiconductor film.

The laser beam used in the present invention is not limited to the continuous wave laser beam. For example, the pulsed laser oscillator with the repetition frequency of 100 MHz or more, which is extremely higher than that used usually (several tens to several hundred Hz), may be used to perform the laser crystallization. It is said that it takes several tens to several hundred ns to solidify the semiconductor film completely after the semiconductor film is irradiated with the pulsed laser beam. Therefore, by setting the pulse repetition frequency of the laser beam to several tens to several hundred MHz, before the region in the semiconductor film melted by the quasi-linear beam spot is solidified, the next quasi-linear beam spot can be delivered to the region overlapping partially the melted region in the semiconductor film. Accordingly, since the interface between the solid phase and the liquid phase can be moved continuously in the semiconductor film, the semiconductor film having the crystal grain grown continuously in the direction perpendicular to the major axis of the quasi-linear beam spot can be formed. Specifically, it is possible to faun an aggregation of crystal grains each having a width of 10 to 30 μm in a direction perpendicular to the major axis of the quasi-linear beam spot and a width of 1 to 5 μm in the major-axis direction. By forming the crystal grain of the single crystal extending long in the direction perpendicular to the major axis of the quasi-linear beam spot, it is possible to form the TFT having almost no crystal grain boundaries which intersect the direction where the carrier moves.

When the repetition frequency is extremely high as described above, the pulse width is short consequently to be the order of picosecond or shorter in accordance with the repetition frequency. As a result, an additional advantage can be obtained in which the interference due to the reflection at the rear surface of the substrate can be suppressed when the laser irradiation is performed vertically to the substrate. The interference can be suppressed because the time for which the light returned to the semiconductor film after reflecting at the rear surface of the 1-mm-thick glass substrate exists simultaneously with the light incident newly into the semiconductor film can be made extremely short when the pulse width is on the order of picosecond. Usually, the pulsed laser has a pulse width of ten to several hundred ns for which the light travels 3 to 100 m. However, when the pulse repetition frequency is extremely high, the pulse width is on the order of picosecond. For example, the light travels approximately 3 mm for a pulse width of 10 ps and this travel distance is much shorter than that when using the conventional pulsed laser. For this reason, the interference can be suppressed more easily between the light returned to the semiconductor film after reflecting at the rear surface of the glass substrate and the light incident newly into the semiconductor film. Therefore, it is not necessary to irradiate the semiconductor film obliquely in consideration of the interference, and the laser irradiation can be performed vertically to the substrate. This makes the optical design easy, and the energy distribution of the obtained beam spot can be made more homogeneous. Moreover, when the laser irradiation is performed obliquely, homogenous laser annealing is difficult because the irradiation condition depends on the scanning direction of the irradiation object. In this case, the laser annealing needs to be performed only in one direction to perform the homogenous laser annealing despite the decrease in throughput. However, since the laser irradiation can be performed vertically by using the extremely high repetition frequency, the irradiation condition does not change depending on the scanning direction. Therefore, the homogeneous laser annealing can be performed even when the irradiation object is scanned so as to move back and forth.

In the case of crystallizing with the use of the conventional pulsed laser, the impurity such as oxygen, nitrogen, or carbon tends to segregate in the crystal grain boundary. In particular, when the crystallization by the laser beam is combined with the crystallization by the catalyst element, the catalyst element not gettered may segregate. In the present invention, since the interface between the solid phase and the liquid phase can be moved continuously, it is possible to prevent the impurity having positive segregation coefficient from segregating, to purify the semiconductor film, and to homogenize the density of the solute like a zone melting method. Therefore, the characteristic of the semiconductor element formed using the semiconductor film can be enhanced, and the variation of the characteristic can be suppressed between the semiconductor elements.

In the present invention, a continuous wave gas or solid-state laser can be used. The gas laser is, for example, an Ar laser or a Kr laser. The solid-state laser is, for example, a YAG laser, a $YVO_4$ laser, a YLF laser, a $YAlO_3$ laser, a $Y_2O_3$ laser, a glass laser, a ruby laser, an alexandrite laser, or a Ti: Sapphire laser.

In the present invention, a pulsed laser oscillator with a repetition frequency of 100 MHz or more can be used. When the repetition frequency of 100 MHz or more is possible, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti: Sapphire laser, a copper vapor laser, or a gold vapor laser can be used.

The method for manufacturing a semiconductor device of the present invention can be applied to the method for manufacturing an integrated circuit or a semiconductor display device. The semiconductor display device is, for example, a liquid crystal display device, a light-emitting device where a light-emitting element typified by an organic light-emitting element is equipped in each pixel, a DMD (digital mnicromirror device), a PDP (plasma display panel), an FED (field emission display), and the like.

When the linear beam spot is formed by the conventional method in which only the optical system is used, homogenizing the energy distribution in the beam spot in its major-axis direction is limited. According to the present invention, however, the quasi-linear beam spot is formed by scanning the beam spot at high speed in the uniaxial direction so that the adjacent beam spots overlap each other. Therefore, the energy distribution of the quasi-linear beam spot in its major-axis direction can be made more homogeneous without complicating the optical system compared with the conventional linear beam spot. Therefore, the crystallinity of the semiconductor film in the major-axis direction of the quasi-linear beam spot can be made more homogeneous, and the variation of the characteristic between the semiconductor elements formed using the semiconductor film can be suppressed.

When homogenizing the energy distribution in the major-axis direction is limited according to the conventional method, it is difficult to extend the linear beam spot longer in the major-axis direction, which interrupts the increase of the throughput. In the present invention, the width of the quasi-linear beam spot can be extended in the major-axis direction by increasing the scanning speed of the laser beam in the major-axis direction while keeping the total energy of the laser beam delivered to any one point. For this reason, the throughput of the laser irradiation can be increased further without complicating the optical system.

Conventionally, a cylindrical lens has been used as an optical system for condensing the laser beam to form a linear beam spot. In the present invention, since the beam spot for forming the quasi-linear beam spot may be circular, the optical system for condensing the laser beam may be a spherical lens. The spherical lens generally has higher accuracy than the cylindrical lens, and therefore, the beam spot can have higher energy density and shorter diameter by the spherical lens. Consequently, in comparison with the conventional linear beam spot, the width of the quasi-linear beam spot in its minor-axis direction can be made shorter, and the width thereof in its major-axis direction can be made longer according to the present invention. Thus, the throughput can be increased further.

Moreover, the crystal grain having large grain size can be formed by moving the interface between the solid phase and the liquid phase continuously in a direction perpendicular to the major axis of the quasi-linear beam spot. Accordingly, at least one island-shaped semiconductor film can be formed within one crystal grain. Thus, the carrier is not trapped in the crystal grain boundary, and the semiconductor device in which the transporting property of the carrier does not decrease can be provided.

BRIEF DESCRIPTION OF THE DRAWINGS

In the accompanying drawings:

FIGS. 7A to 7C are drawings for showing a manufacturing method of a semiconductor device of the present invention;

FIGS. 8A to 8D are drawings for showing a manufacturing method of a semiconductor device of the present invention;

FIGS. 9A to 9D are drawings for showing a manufacturing method of a semiconductor device of the present invention;

DETAILED DESCRIPTION OF THE INVENTION

[Embodiment Mode]

Embodiment modes and embodiments are hereinafter described with reference to drawings. However, since the present invention can be embodied in many different modes, it is easily understood by those who are skilled in the art that the mode and the detail of the present invention can be changed and modified within the content and the scope of the present invention. Therefore, the present invention is not limited to the description of the embodiment modes and the embodiments. Moreover, the shape of the beam spot in the following embodiment modes and embodiments is not limited to circular, and it may be elliptical or rectangular.

[Embodiment Mode 1]

Figure 1A:
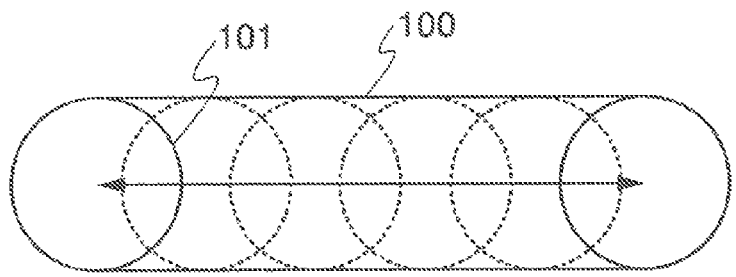
FIGS. 1A to 1C are drawings for showing the steps of forming a quasi-linear beam spot by scanning a beam spot in a uniaxial direction.
Figure 1B:
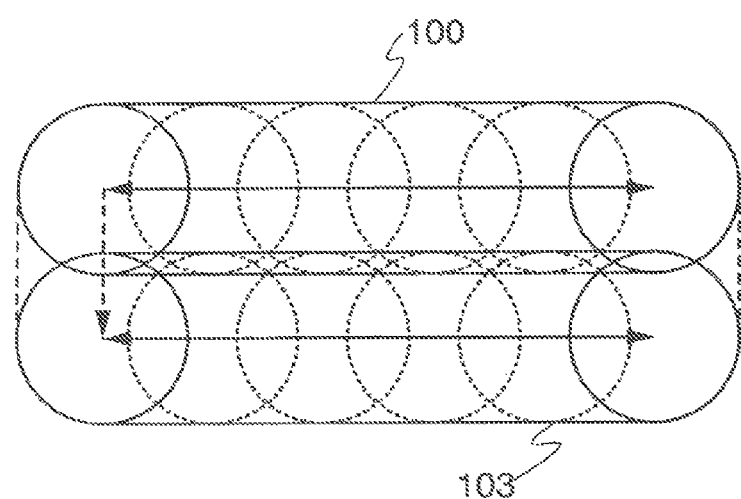

A step of forming a quasi-linear beam spot used in the present invention is described with reference to FIGS. 1A to 1C. As shown in FIG. 1A, a quasi-linear beam spot 100 is formed by scanning a beam spot 101 of the laser beam in a uniaxial direction or along a straight line as indicated by a solid-line arrow.

In FIG. 1A, the quasi-linear beam spot 100 is formed by scanning the beam spot 101 so as to move it back and forth. However, the present invention is not limited to this configuration, and the quasi-linear beam spot 100 may be formed by scanning the beam spot 101 in only one direction. Moreover, FIG. 1A illustrates the quasi-linear beam spot 100 formed in such a way that after the beam spot 101 is scanned from left to right, it is scanned from right to left again. However, the present invention is not limited to this configuration. In the present invention, the beam spot 101 may be scanned at least once in any one point in the quasi-linear beam spot 100.

In the case of using the semiconductor film as the irradiation object, the scanning speed of the beam spot 101 is set so that before any one point in the semiconductor film melted by the laser beam is solidified completely, the one point is irradiated again with the next laser beam. In the case of FIG. 1A, when the laser beam is scanned from right to left, the scanning speed of the beam spot 101 is set so that before the right end of the quasi-linear beam spot 100 in the uniaxial direction melted by the beam spot 101 is solidified, the beam spot 101 is scanned to the left end thereof in the uniaxial direction. Thus, the quasi-linear beam spot can keep the irradiation object melted for a certain period.

In the case of forming the quasi-linear beam spot by the pulsed laser beam, the pulsed laser beam is scanned so that the adjacent pulsed beam spots overlap each other.

The scanning speed of the laser beam in the uniaxial direction is set so that the total energy of the laser beam delivered to any one point can melt the semiconductor film.

Although the present embodiment mode has described an example of forming the quasi-linear beam spot 100 by scanning the beam spot 101 only in the uniaxial direction, the present invention is not limited to this configuration. The beam spot 101 may be scanned in two or more directions when the quasi-linear beam spot 100 can be formed in the end.

In the present invention, the quasi-linear beam spot 100 is scanned further in a direction perpendicular to the uniaxial direction, which is the direction perpendicular to the major axis of the quasi-linear beam spot 100. FIG. 1B shows the step of forming a quasi-linear beam spot 103 by scanning the quasi-linear beam spot 100 shown in FIG. 1A in a direction indicated by a dotted-line arrow, which is perpendicular to the major axis of the quasi-linear beam spot 100.

Within the quasi-linear beam spot 100, the semiconductor film is not in a completely melted state. Therefore, the interface between the solid phase and the liquid phase can be moved continuously by irradiating the semiconductor film with the quasi-linear beam spot 103 which partially overlaps the quasi-linear beam spot 100 before the semiconductor film irradiated with the quasi-linear beam spot 100 is solidified.

Figure 1C:
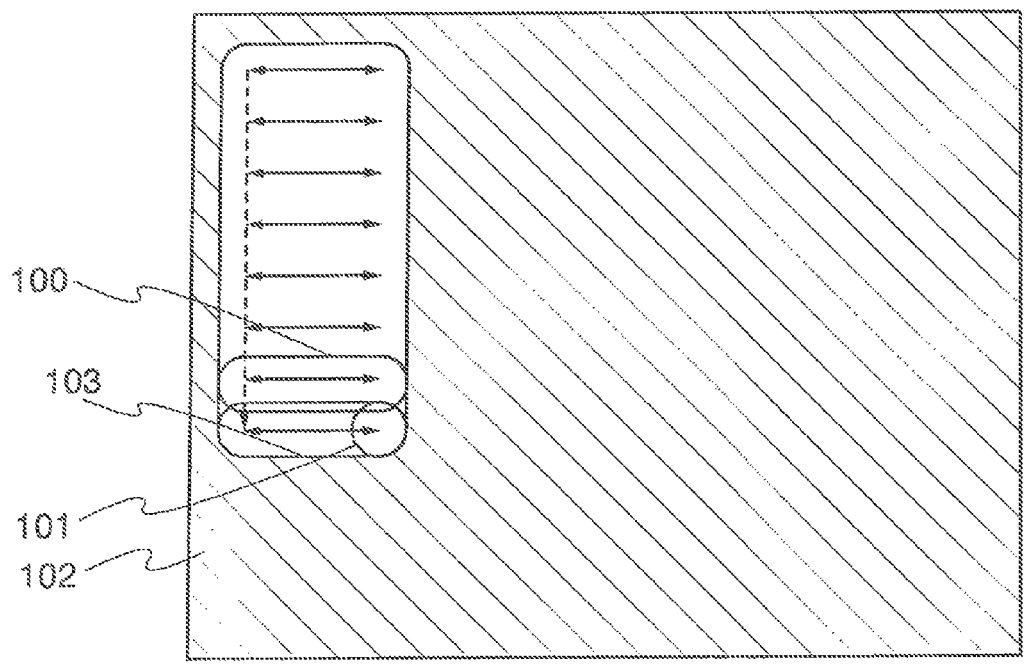

FIG. 1C illustrates the step of crystallizing the semiconductor film by repeating the above operation. In FIG. 1C, the semiconductor film 102, which is the irradiation object, is crystallized by scanning the beam spot 101 along plural straight lines arranging at uniform intervals as indicated by an arrow. In this case, the quasi-linear beam spot 100, which is formed by scanning the laser beam along a straight line, and the quasi-linear beam spot 103, which is formed by scanning the laser beam along the next straight line, are scanned so that they partially overlap as shown in FIG. 1B. This can form a crystal grain of a single crystal extending long in the scanning direction indicated by the dotted-line arrow. Specifically, the quasi-linear beam spot 100 and the quasi-linear beam spot 103 overlap in such a way that regions in these beam spots along their major axes overlap each other.

The scanning speed of the laser beam is set so that before a part of the irradiation object irradiated with the quasi-linear beam spot 100 is solidified, the quasi-linear beam spot 103 can be formed. More specifically, the laser irradiation is performed in such a way that before a region of the irradiation object melted by any one of plural beam spots constituting the quasi-linear beam spot 100 is solidified, one of plural beam spots constituting the quasi-linear beam spot 103 is delivered so as to overlap the melted region. Thus, the crystal grain in the irradiation object can be grown continuously in one direction, and a large crystal grain can be formed.

It takes approximately 100, ns to solidify silicon after being irradiated with the laser beam. Therefore, when the irradiation object is silicon in this embodiment mode, the quasi-linear beam spot 103 may be formed within 100, ns after the quasi-linear beam spot 100 begins to be formed.

Figure 2:
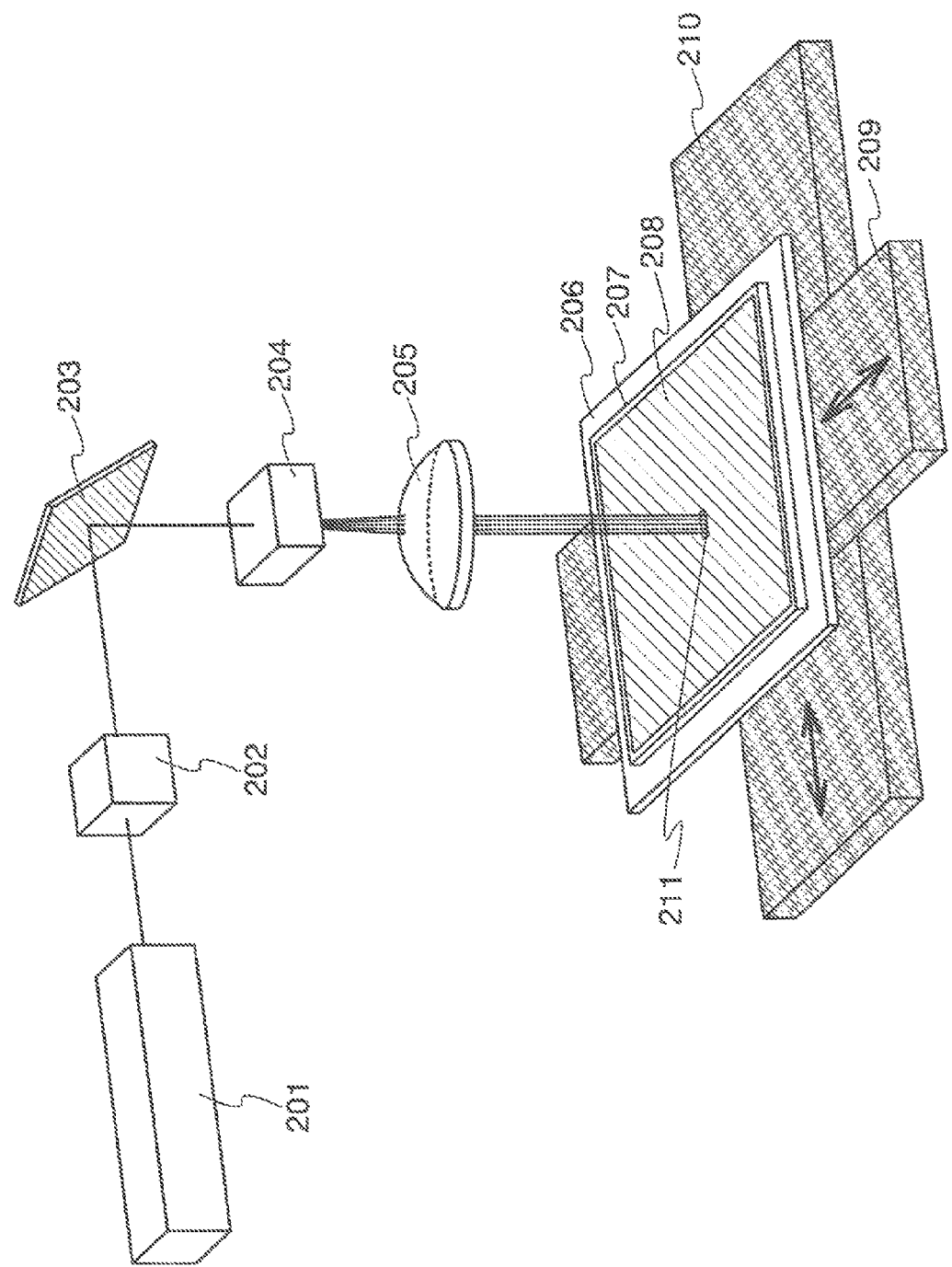
FIG. 2 is a drawing of an example of a laser irradiation apparatus of the present invention.

Next, a configuration of the laser irradiation apparatus of the present invention is described. FIG. 2 shows an example of the laser irradiation apparatus of the present invention. The laser irradiation apparatus illustrated in FIG. 2 includes a laser oscillator 201, a condensing optical system 202, a mirror 203, an acousto-optic element 204, an fθ lens 205, a stage 206, an X-axis direction position controlling means 209, and a Y-axis direction position controlling means 210.

The laser oscillator 201 is, for example, a continuous wave laser oscillator or a pulsed laser oscillator with a repetition frequency of 100 MHz or more. In this embodiment mode, the laser oscillator 201 is a continuous wave $YVO_4$ laser providing 10 W and emitting a laser beam whose cross section is circular and has a diameter of 1 mm.

The laser beam emitted from the laser oscillator 201 is incident into the condensing optical system 202. The condensing optical system 202 may be any kind of optical system which can condense the laser beam, and it may be, for example, a spherical lens or a Flesnel lens. In this embodiment mode, the laser beam having the circular cross section is reduced in size from a diameter of 1 mm to a diameter of 0.1 mm by the condensing optical system 202. The laser beam condensed by the condensing optical system 202 is reflected on the mirror 203 and incident into the acousto-optic element 204.

When an acoustic wave such as a supersonic wave, which has high frequency, is applied to the acousto-optic element 204, the refractive index of the acousto-optic element 204 is modulated periodically. Therefore, the laser beam incident into the acousto-optic element 204 can be deflected with high frequency on the order of gigahertz. The beam spot can be scanned repeatedly with high frequency in the uniaxial direction by using the acousto-optic element 204. Although this embodiment mode uses the acousto-optic element as the optical system for scanning the beam spot repeatedly in the uniaxial direction, the present invention is not limited to this configuration. The optical system such as a polygon mirror or a resonant scanner, which can scan the beam spot repeatedly with high frequency in the uniaxial direction, can be used.

The laser beam deflected by the acousto-optic element 204 is incident into the fθ lens 205. The deflected laser beam is condensed by the fθ lens 205 so that the laser beam is always focused on the irradiation object. The stage 206 can have the irradiation object mounted thereover. FIG. 2 shows an example in which the irradiation object is a semiconductor film 208 formed over a substrate 207. With the fθ lens 205 for focusing the laser beam on the semiconductor film 208 mounted over the stage 206, the beam spot scanned periodically in the uniaxial direction can be formed. A trajectory of the beam spot scanned periodically in the uniaxial direction is illustrated as a quasi-linear beam spot 211 in FIG. 2.

Figure 3A:
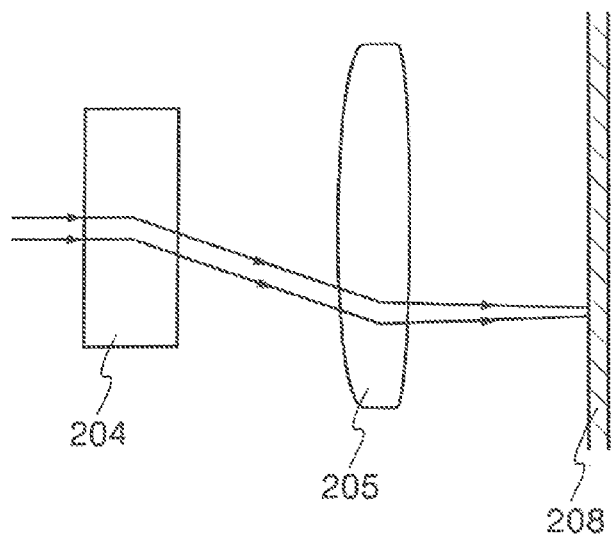
FIGS. 3A to 3C are drawings for showing the steps of forming a quasi-linear beam spot by a laser beam deflected at an acousto-optic element.
Figure 3B:
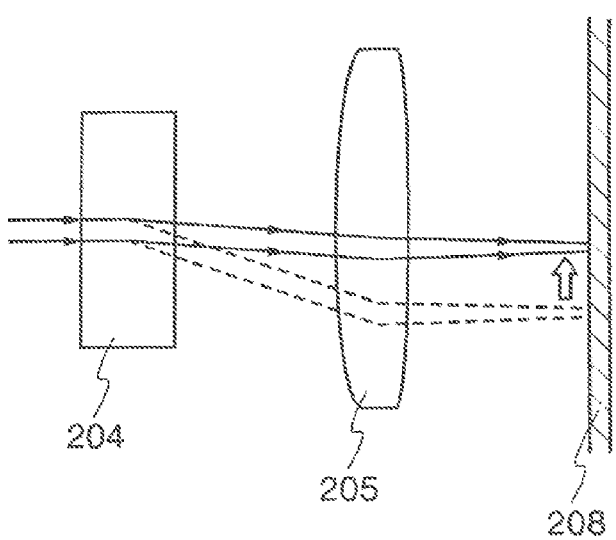
Figure 3C:
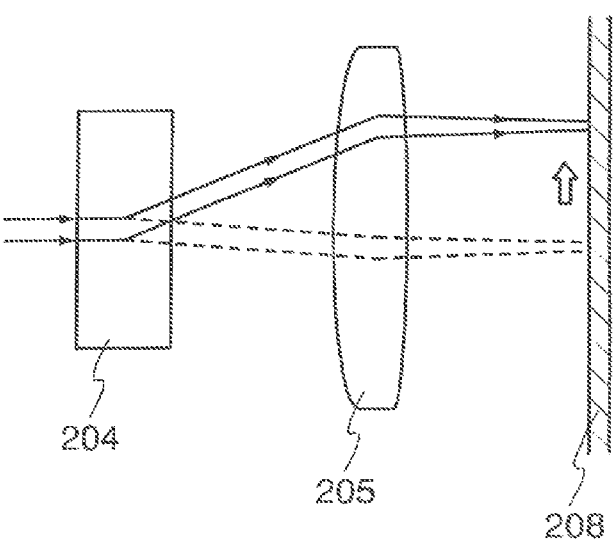

With reference to FIGS. 3A to 3C, the step of forming the quasi-linear beam spot 211 by the laser beam deflected at the acousto-optic element 204 is described. In FIGS. 3A to 3C, the laser beam deflected by the acousto-optic element 204 and the fθ lens 205 shown in FIG. 2 is scanned on the semiconductor film 208. As shown in FIGS. 3A to 3C, after the laser beam indicated by the solid-line arrow is deflected by the acousto-optic element 204, the laser beam is condensed by the fθ lens 205, and the laser beam is focused on the semiconductor film 208.

Then, when the refractive index of the acousto-optic element 204 is modulated in order of FIGS. 3A, 3B, and 3C, the laser beam is deflected in a direction indicated by a white arrow. With the deflection of the laser beam, the region on the semiconductor film 208 where the laser beam is focused, which is the beam spot, is scanned in the uniaxial direction.

Since it is necessary that the semiconductor film 208 is not solidified completely within the quasi-linear beam spot 211, the beam spot needs to be scanned in uniaxial direction at the speed satisfying the above condition. In the case of the laser irradiation apparatus shown in FIG. 2, the scanning speed of the beam spot in the uniaxial direction can be controlled by the frequency of the acoustic wave applied to the acousto-optic element 204.

In this embodiment mode, the refractive index of the acousto-optic element 204 is modulated with the frequency of 80 MHz. In this embodiment mode, the beam spot formed on the semiconductor film 208 by the fθ lens 205 has a diameter of 5 μm. When the quasi-linear beam spot 211 is formed under the above condition, the quasi-linear beam spot 211 has a width of 5 μm in its minor-axis direction and a width of approximately 400 μm in the uniaxial direction or the major-axis direction.

In the laser irradiation apparatus shown in FIG. 2, the quasi-linear beam spot 211 can be scanned in a direction perpendicular to the uniaxial direction (a direction perpendicular to the major axis of the quasi-linear beam spot) by the X-axis direction position controlling means 209 which can move the stage 206 in the X-axis direction. That is to say, the position of the irradiation object relative to the laser beam can be moved in a direction indicated by a dotted-line arrow in FIG. 1C. The speed of moving the X-axis direction position controlling means 209 is much lower than the scanning speed of the beam spot 101 in the uniaxial direction. This can achieve the scanning shown in FIG. 1C. The X-axis direction position controlling means 209 moves the stage 206 at the constant speed in a direction perpendicular to the major axis of the quasi-linear beam spot. Moreover, the laser irradiation apparatus shown in FIG. 2 includes the Y-axis direction position controlling means 210 which can move the stage 206 in a Y-axis direction perpendicular to the X-axis direction.

Although the two position controlling means of the X-axis direction position controlling means 209 and the Y-axis direction position controlling means 210 are used in FIG. 2 to control the position of the quasi-linear beam spot 211 relative to the stage 206, the present invention is not limited to this configuration. The laser irradiation apparatus of the present invention may have at least the X-axis direction position controlling means 209. In addition to the X-axis direction position controlling means 209, another position controlling means may be provided which can rotate the stage 206 in the plane including the stage 206.

In this embodiment mode, the semiconductor film 208 is crystallized by scanning the laser beam along plural straight lines arranging at uniform intervals as shown in FIG. 1C with the use of the acousto-optic element 204 and at least the X-axis direction position controlling means 209.

In this embodiment mode, the stage 206 is scanned in the X-axis direction at a speed of 100 mm/s or more by the X-axis direction position controlling means 209. When the whole surface of the semiconductor film 208 is irradiated with the laser beam, the laser irradiation may be performed in the following way. After scanning the quasi-linear beam spot 211 in the major-axis direction by the Y-axis direction position controlling means 210, the quasi-linear beam spot 211 is scanned in the X-axis direction by the X-axis direction position controlling means 209 again, and this operation is performed repeatedly. Moreover, the position of the quasi-linear beam spot 211 relative to the stage 206 may be controlled by moving the optical system itself. In such a case, the stage does not need to move, and the optical system denoted with the reference numerals 201 to 205 in FIG. 2 may be moved in both X-axis direction and Y-axis direction.

When the laser oscillator 201 is the pulsed laser oscillator, the length of the quasi-linear beam spot 211 in the major-axis direction is limited by the repetition frequency of the pulse oscillation. Consequently, it is necessary to design the quasi-linear beam spot 211 in consideration of the repetition frequency of the pulse oscillation. Specifically, the pulse repetition frequency F [MHz] may satisfy the following inequality 1 where d is the length [μm] of the beam spot in the uniaxial direction, L is the width [μm] of the quasi-linear beam spot 211 in the uniaxial direction, and f is the frequency [MHz] of the deflection by the acousto-optic element 204.

$$F \geq 2Lf/d \qquad \text{[Inequality 1]}$$

For example, when the beam spot has a length d of 10 μm in the uniaxial direction, the quasi-linear beam spot 211 has a width L of 200 μm in the uniaxial direction, and the frequency f of the deflection by the acousto-optic element 204 is 10 MHz it is understood from the inequality 1 that the pulse repetition frequency F may be 400 MHz or more.

In the laser irradiation apparatus shown in FIG. 2, the condensing optical system 202 is not always necessary. However, by using the condensing optical system 202, a smaller acousto-optic element can be used because the size of the cross section of the laser beam incident into the acousto-optic element 204 can be suppressed. Moreover, the optical system such as a mirror 203 which deflects the optical path of the laser beam is not always necessary, and it may be provided appropriately as needed. Furthermore, the fθ lens 205 is not always necessary. However, by using the fθ lens 205, the speed and the size of the beam spot scanned in the uniaxial direction within the quasi-linear beam spot 211 can be made constant.

The optical system used in the laser irradiation apparatus of the present invention is not limited to that shown in FIG. 2, and another optical system may be added appropriately by the designer.

[Embodiment Mode 2]

Figure 11A:
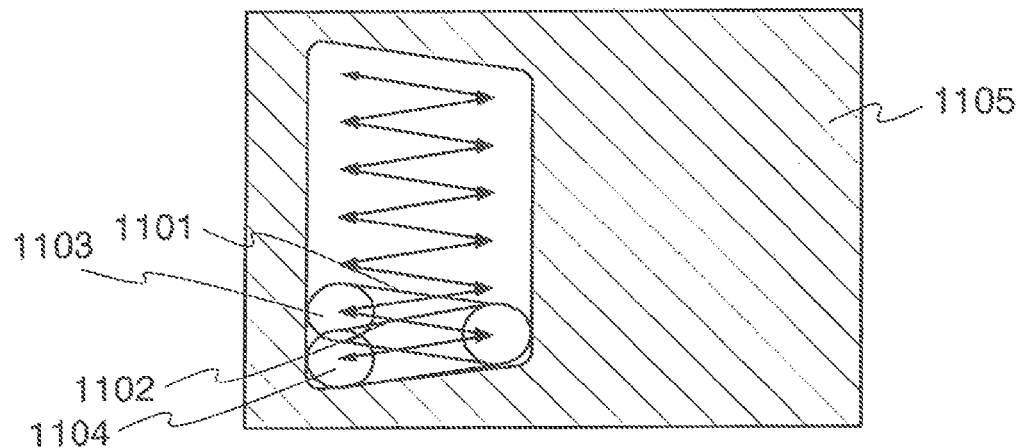
FIGS. 11A to 11C are drawings for showing the step of forming a quasi-linear beam spot by scanning a beam spot in a uniaxial direction.
Figure 11B:
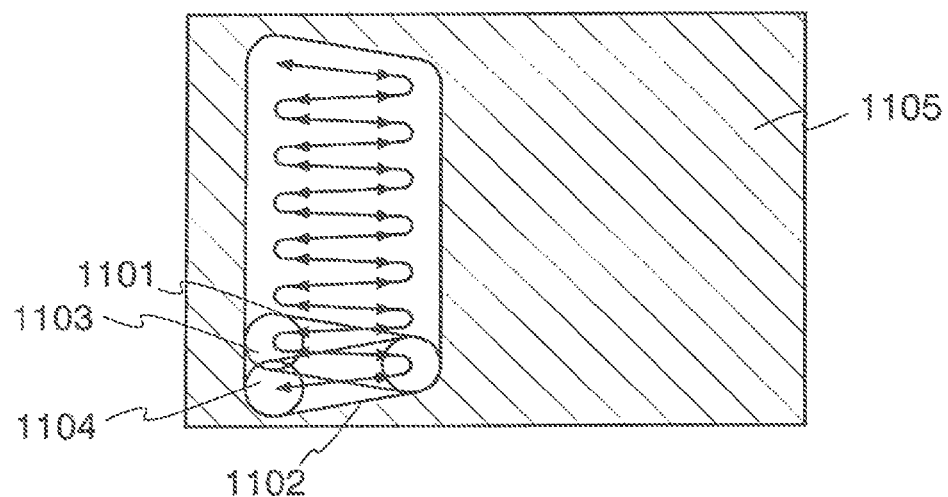
Figure 11C:
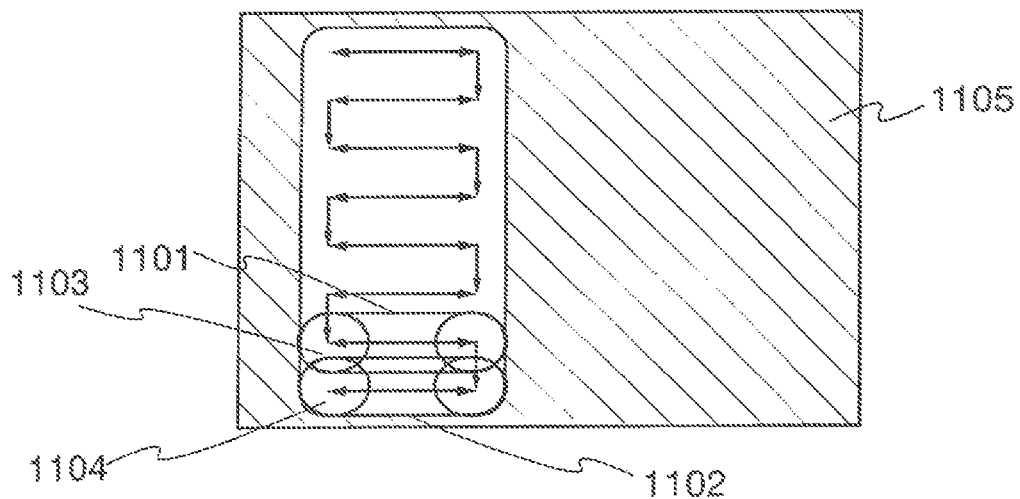

With reference to FIGS. 11A to 11C, this embodiment mode describes a scanning method of the laser beam which is different from the scanning method shown in the embodiment mode 1. Other parts of this embodiment mode except the scanning method of the laser beam are the same as those in the embodiment mode 1. The laser irradiation apparatus shown in FIG. 2 is used in this embodiment mode.

In FIGS. 11A to 11C, reference numerals 1101 and 1102 denote quasi-linear beam spots, reference numerals 1103 and 1104 denote beam spots, and a reference numeral 1105 denotes a semiconductor film, which is the irradiation object. By scanning the beam spot shown in FIGS. 11A to 11C, the quasi-linear beam spot is formed in the same way as the embodiment mode 1. The quasi-linear beam spot 1101 and the quasi-linear beam spot 1102, which is formed sequentially after the quasi-linear beam spot 1101, are scanned so that regions in these beam spots parallel to their major axes overlap each other.

The laser beam is scanned along a saw-like line in FIG. 11A, along a wave-like line in FIG. 11B, and along a comb-like line in FIG. 11C. When the laser beam is scanned along the saw-like line or the wave-like line as shown in FIGS. 11A and 11B, the opposite end portions of the quasi-linear beam spot are hereinafter referred to as direction-turning points. In the case of partially overlapping the quasi-linear beam spots 1101 and 1102 in FIGS. 11A and 11B, the quasi-linear beam spots 1101 and 1102 overlap partially automatically by overlapping the beam spot 1103 centering on a certain direction-turning point and the beam spot 1104 centering on the direction-turning point after the next direction-turning point. In FIG. 11B, the arrow is not at the direction-turning point on the wave-like line but is just before the direction-turning point. However, actually, the quasi-linear beam spot is formed by moving the laser beam back and forth on the wave-like line between the direction-turning point and the next direction-turning point.

FIG. 11C is a scanning method in which the scanning method shown in FIG. 1C of the embodiment mode 1 is modified. In FIG. 1C, after forming the quasi-linear beam spot 100, the beam spot 101 is not scanned on the irradiation object until the quasi-linear beam spot 103 is formed. Meanwhile, FIG. 11C shows an example of keeping the laser irradiation to the irradiation object even after forming the quasi-linear beam spot 1101 and before forming the quasi-linear beam 1102. To homogenize the energy density distribution of the laser beam delivered to the semiconductor film 1105 by the scanning method shown in FIG. 11C, the scanning speed is increased or the output of the laser beam is lowered at the opposite ends of the quasi-linear beam spot. Thus, the total energy of the laser beam absorbed in the opposite ends of the quasi-linear beam spot can be made substantially the same as that in the region irradiated with other beam spots.

In the case of the scanning methods shown in FIGS. 11A and 11B, the laser beam is scanned at least once from the direction-turning point, which is the center of the beam spot 1103, to the direction-turning point, which is the center of the beam spot 1104, through one direction-turning point. For this reason, in order to grow the crystal grain continuously in a direction perpendicular to the major axis of the quasi-linear beam spot, the laser beam may be scanned up to the position of the beam spot 1104 in the figure before a part of the semiconductor film 1105 irradiated with the beam spot 1103 is solidified. Then, accordingly, the quasi-linear beam spot 1102 can be formed before a part of the irradiation object irradiated with the quasi-linear beam spot 1101 is solidified, and the interface between the solid phase and the liquid phase can be moved in a direction perpendicular to the major axis of the quasi-linear beam spot. Thus, a large crystal grain can be formed.

In FIG. 11C, the laser beam is scanned from the first angle of the comb-like line, which is the center of the beam spot 1103, to the fourth angle thereof, which is the center of the beam spot 1104, through the second and third angles. Therefore, in order to grow continuously the crystal grain in a direction perpendicular to the major axis of the quasi-linear beam spot, the laser beam may be scanned up to the position of the beam spot 1104 in the figure before a part of the semiconductor film 1105 irradiated with the beam spot 1103 is solidified. As a result, the quasi-linear beam spot 1102 can be formed before a part of the irradiation object irradiated with the quasi-linear beam spot 1101 is solidified, and the interface between the solid phase and the liquid phase can be moved in a direction perpendicular to the major axis of the quasi-linear beam spot. Thus, the large crystal grain can be formed.

In the quasi-linear beam spot 1101, the beam spot 1103 is delivered to the irradiation object first. Meanwhile, in the quasi-linear beam spot 1102, the beam spot 1104 is delivered to the irradiation object last. Consequently, in order to grow the crystal grain continuously in a direction perpendicular to the major axis of the quasi-linear beam spot, the laser beam may be scanned to the position of the beam spot 1104 in the figure before a part of the semiconductor film 1105 irradiated with the beam spot 1103 is solidified. Then, accordingly, the quasi-linear beam spot 1102 can be formed before a part of the irradiation object irradiated with the quasi-linear beam spot 1101 is solidified, and the interface between the solid phase and the liquid phase can be moved in a direction perpendicular to the major axis of the quasi-linear beam spot. Thus, a large crystal grain can be formed.

The scanning methods shown in FIGS. 11A to 11C can be achieved by moving both the acousto-optic element 204 and the X-axis direction position controlling means 209 in FIG. 2 in a timely manner. The acousto-optic element 204 deflects the laser beam at a certain frequency. By moving the X-axis direction position controlling means in accordance with the certain frequency of the acousto-optic element 204, various scanning methods shown in FIGS. 11A to 11C are achieved. In the scanning methods shown in FIGS. 11A and 11B, the stage is moved by the X-axis direction position controlling means while scanning the laser beam by the acousto-optic element. Moreover, in the scanning method shown in FIG. 11C, the stage is moved by the X-axis direction position controlling means while scanning the laser beam by the acousto-optic element. In the scanning method of FIG. 11C, the stage is moved by the X-axis direction position controlling means when the laser beam is at the end portion of the quasi-linear beam spot.

[Embodiment Mode 3]

Another embodiment mode of the present invention is described.

Figure 4A:
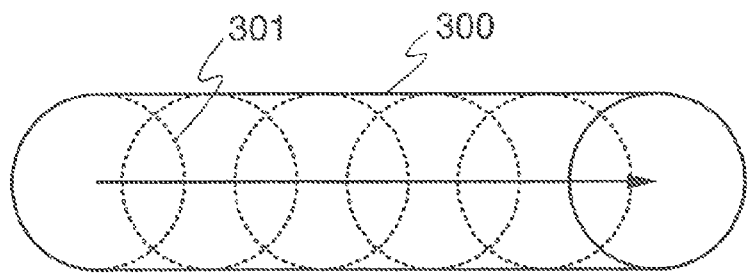
FIGS. 4A to 4C are drawings for showing the steps of forming a quasi-linear beam spot by scanning a laser beam in a uniaxial direction.
Figure 4B:
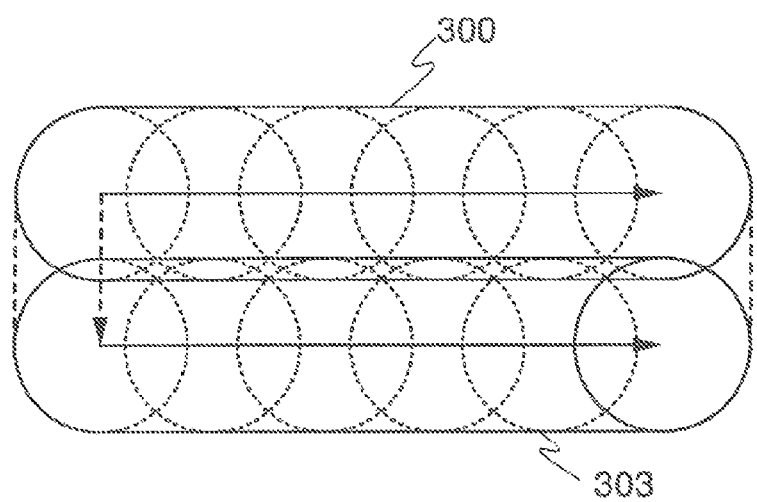

First, the step of forming a quasi-linear beam spot used in the present invention is described with reference to FIGS. 4A to 4C. FIG. 4A shows a quasi-linear beam spot 300 formed by scanning a beam spot 301 of a laser beam in one direction or along a straight line as indicated by a solid-line arrow.

In FIG. 4A, unlike the embodiment mode 1 the beam spot 301 is scanned only in one direction to form the quasi-linear beam spot 300. The total time of laser irradiation can be homogenized in any one point within the quasi-linear beam spot 300 by scanning the beam spot 301 only in one direction as shown in FIG. 4A. Although FIG. 4A illustrates the beam spot 301 scanned from left to right, the present invention is not limited to this configuration. In the present invention, the beam spot 301 may be scanned at least once in any one point within the quasi-linear beam spot 300.

In the case of FIG. 4A, the scanning speed of the beam spot 301 may be set so that before the region at the left edge in a uniaxial direction, which is melted by the beam spot 301, is solidified, the beam spot 301 is scanned to the right edge in the uniaxial direction within the quasi-linear beam spot 300.

In this embodiment mode, in the same way as the embodiment mode 1 the scanning speed of the laser beam in the one direction is set so that the total energy of the laser beam delivered to any one point can melt the semiconductor film.

Although this embodiment mode showed the example of forming the quasi-linear beam spot 300 by scanning the beam spot 301 only in the one direction, the present invention is not limited to this configuration. The beam spot may be scanned in two or more directions when the quasi-linear beam spot 300 is formed in the end.

The quasi-linear beam spot 300 is scanned further in the direction perpendicular to the one direction, which is the direction perpendicular to the major axis of the quasi-linear beam spot 300. FIG. 4B shows the step of forming the quasi-linear beam spot 303 by scanning the quasi-linear beam spot 300 shown in FIG. 4A in the direction perpendicular to the major axis of the quasi-linear beam spot 300 as indicated by a dotted-line arrow.

Within the quasi-linear beam spot 300, the semiconductor film is not solidified completely but is still melted. Therefore, the interface between the solid phase and the liquid phase can be moved continuously in the semiconductor film by irradiating the semiconductor film with the quasi-linear beam spot 303 before a part of the semiconductor film irradiated with the quasi-linear beam spot 300 is solidified. At this time, the quasi-linear beam spots 300 and 303 partially overlap each other.

FIG. 4C and FIGS. 12A to 12C show the step of crystallizing the semiconductor film by repeating the above operation. The semiconductor film 302, which is the irradiation object, is crystallized by the laser beam while scanning the beam spot 301 along plural straight lines arranging at uniform intervals. In this case, as shown in FIG. 4B, the quasi-linear beam spot 300 partially overlaps the quasi-linear beam spot 303 formed sequentially, and the quasi-linear beam spot 303 is formed before the part of the irradiation object irradiated with the quasi-linear beam spot 300 is solidified. Thus, a crystal grain of a single crystal extending long in the scanning direction indicated by an arrow can be formed. Specifically, the adjacent quasi-linear beam spots overlap in such a way that regions in these beam spots along their major axes overlap each other. Moreover, in the case of using silicon as the irradiation object, since it takes approximately 100 ns to solidify silicon, the quasi-linear beam spot 303 is formed within 100 ns after the quasi-linear beam spot 300 begins to be formed.

Figure 12A:
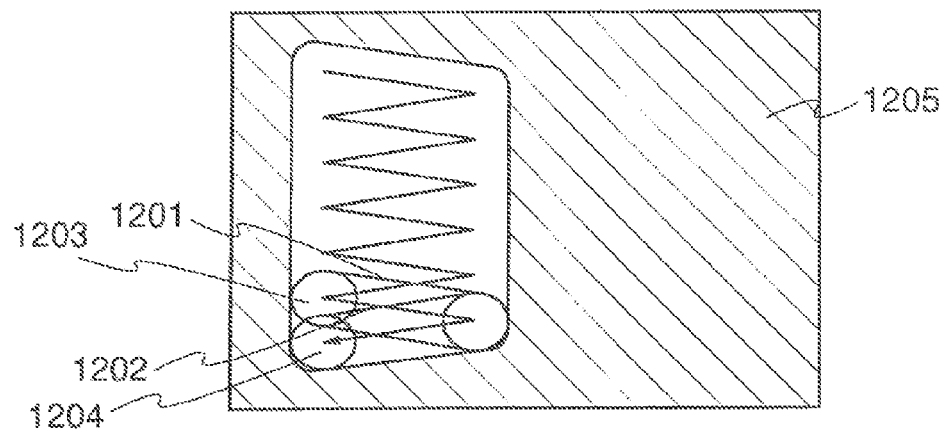
FIGS. 12A to 12C are drawings for showing the step of forming a quasi-linear beam spot by scanning a beam spot in a uniaxial direction.
Figure 12B:
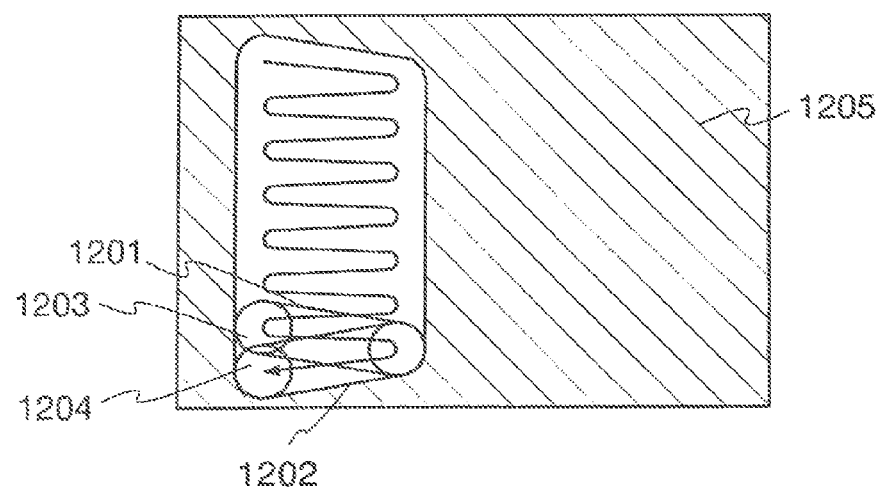
Figure 12C:
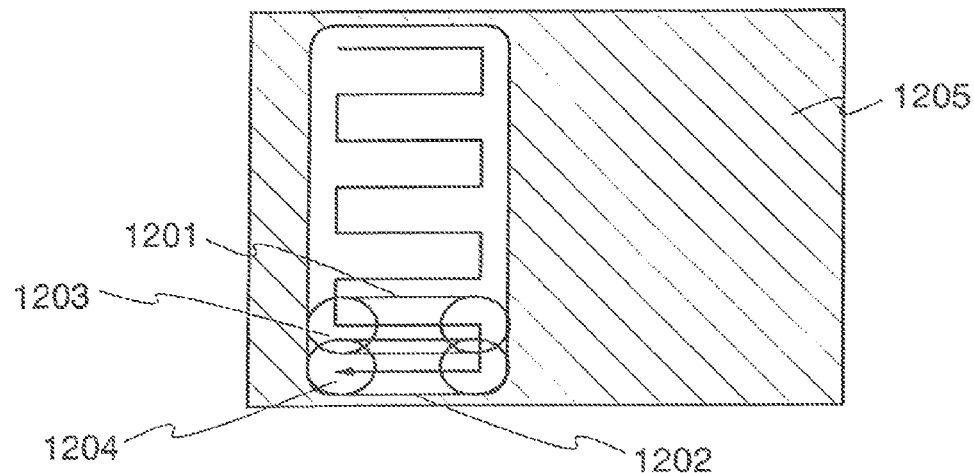

FIGS. 12A to 12C show various scanning methods of the laser beam. The laser beam is scanned along a saw-like line or a zigzag line in FIG. 12A, a wave-like line in FIG. 12B, and a comb-like line in FIG. 12C. In the same way as FIG. 4C, the quasi-linear beam spot 1201 partially overlaps the next quasi-linear beam spot 1202, and the quasi-linear beam spot 1202 is formed before the part of the irradiation object irradiated with the quasi-linear beam spot 1201 is solidified.

In the scanning methods shown in FIGS. 12A and 12B, the quasi-linear beam spots 1201 and 1202 partially overlap automatically when they are formed in such a way that the beam spot 1203 centering on a certain direction-turning point overlaps partially the beam spot 1204 centering on the direction-turning point after the next direction-turning point.

Figure 4C:
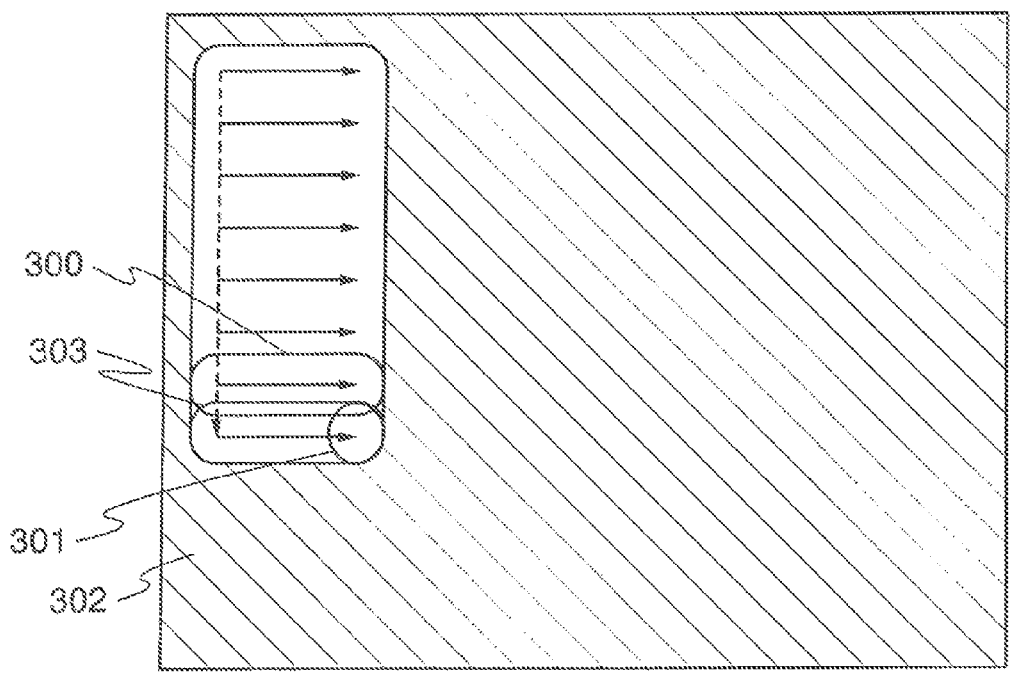

FIG. 12C is a modification of FIG. 4C and shows an example of keeping the laser irradiation to the irradiation object even after forming the quasi-linear beam spot 1201 and before forming the quasi-linear beam spot 1202. To homogenize the energy density distribution of the laser beam delivered to the semiconductor film 1205 by the scanning method shown in FIG. 12C, the scanning speed is increased or the output power of the laser beam is lowered at the opposite ends of the quasi-linear beam spot. Thus, the laser energy absorbed in the opposite ends of the quasi-linear beam spot can be made almost the same as that in other irradiated regions.

Moreover, in the quasi-linear beam spot 1201, the beam spot 1203 is delivered to the irradiation object first. Meanwhile, in the quasi-linear beam spot 1202, the beam spot 1204 is delivered to the irradiation object last. Specifically, in FIGS. 12A and 12B, the laser beam is scanned from the direction-turning point, which is the center of the beam spot 1203, to another direction-turning point, which is the center of the beam spot 1204, through another direction-turning point. In the case of FIG. 12C, the laser beam is scanned along the comb-like line from one angle, which is the center of the beam spot 1203, to another angle, which is the center of the beam spot 1204, through another two angles. Therefore, in order to grow the crystal grain continuously in a direction perpendicular to the major axis of the quasi-linear beam spot, the laser beam may be scanned to the position of the beam spot 1204 in the figure before the part of the semiconductor film 1205 irradiated with the beam spot 1203 is solidified. As a result, the quasi-linear beam spot 1202 is formed before the part of the irradiation object irradiated with the quasi-linear beam spot 1201 is solidified, and the crystal having large grain size can be formed.

It takes approximately 100 ns to solidify silicon after being irradiated with the laser beam. Therefore, when the semiconductor film 1205, which is the irradiation object, is silicon, the laser beam may be scanned to the position of the beam spot 1204 in the figure within 100 ns after the beam spot 1203 is delivered to the semiconductor film 1205.

Figure 5:
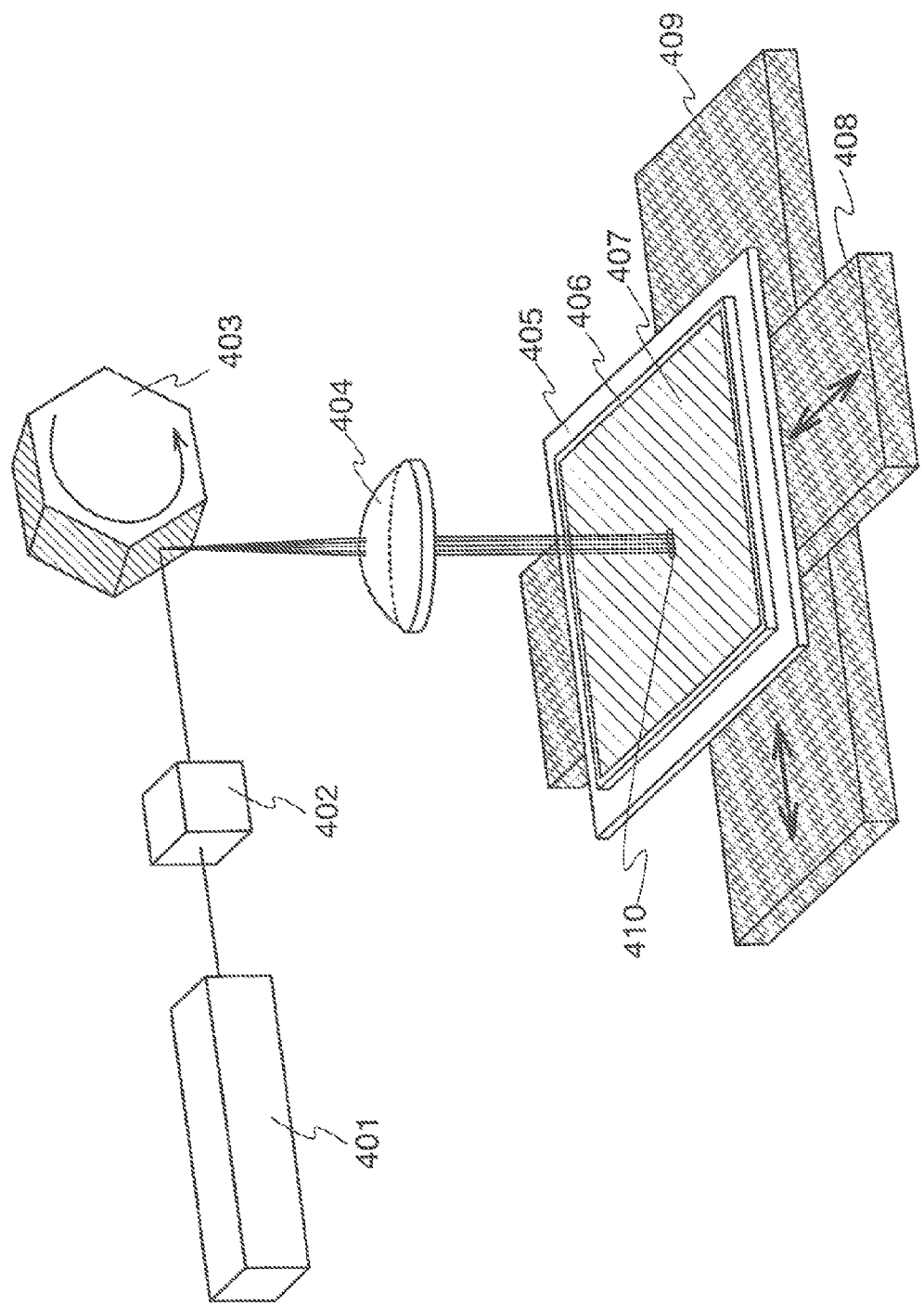
FIG. 5 is a drawing of an example of a laser irradiation apparatus of the present invention.

Next, a configuration of the laser irradiation apparatus in this embodiment mode is described. FIG. 5 shows an example of the laser irradiation apparatus of this embodiment mode. The laser irradiation apparatus shown in FIG. 5 includes a laser oscillator 401, a condensing optical system 402, a polygon mirror 403, an fθ lens 404, a stage 405, an X-axis direction position controlling means 408, and a Y-axis direction position controlling means 409.

The laser oscillator 401 can be, for example, a continuous wave laser oscillator or a pulsed laser oscillator with a repetition frequency of 100 MHz or more in the same way as the embodiment mode 1. A laser beam emitted from the laser oscillator 401 is incident into the condensing optical system 402. The condensing optical system 402 may be any optical system when it can condense the laser beam, and it may be, for example, a spherical lens or a Flesnel lens. The laser beam condensed by the condensing optical system 402 is incident into the polygon mirror 403.

The polygon mirror 403 is a rotator having a series of flat reflecting planes provided continuously therearound. When the laser beam is incident into the polygon mirror 403, the polygon mirror 403 can deflect the laser beam repeatedly in the same direction. By using the polygon mirror 403, the beam spot can be scanned repeatedly in a uniaxial direction at high frequency.

The laser beam deflected by the polygon mirror 403 is incident into the fθ lens 404. The fθ lens 404 can condense the deflected laser beam so as to focus it on the irradiation object constantly. The stage 405 can have the irradiation object mounted thereover. In FIG. 5, the irradiation object is a semiconductor film 407 formed over a substrate 406. A quasi-linear beam spot scanned periodically in the uniaxial direction can be formed when the fθ lens 404 focuses the laser beam on the semiconductor film 407 mounted over the stage 405. The trajectory of the beam spot scanned periodically in the uniaxial direction is illustrated as a quasi-linear beam spot 410 in FIG. 5.

Figure 6A:
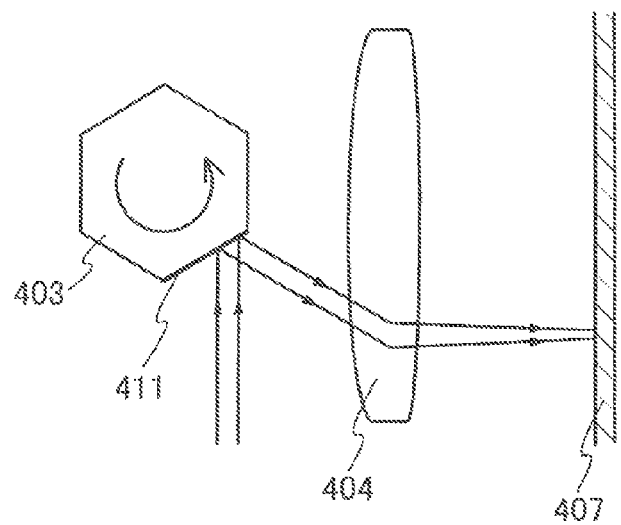
FIGS. 6A to 6C are drawings for showing the step of forming a quasi-linear beam spot by a laser beam deflected at a polygon mirror.
Figure 6B:
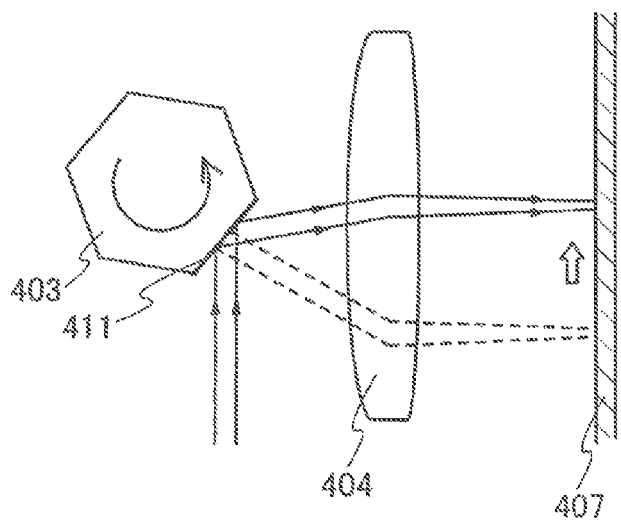
Figure 6C:
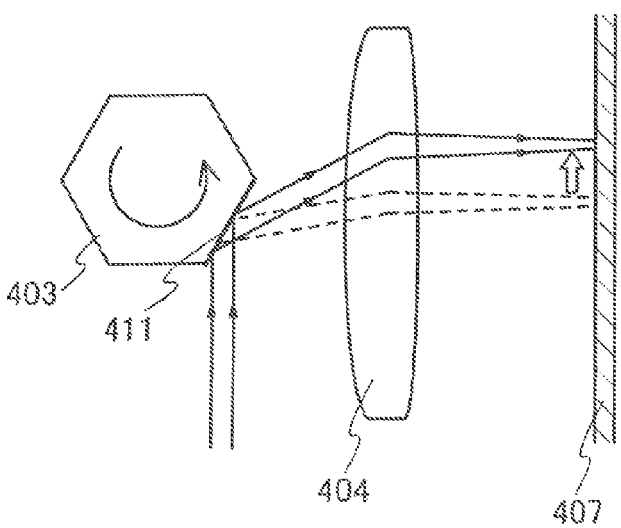

FIG. 6 illustrates the step of forming the quasi-linear beam spot 410 by the laser beam deflected by the polygon mirror 403. FIGS. 6A to 6C are the drawings in which the laser beam deflected by the polygon mirror 403 and the fθ lens 404 is scanned on the semiconductor film 407. As shown in FIGS. 6A to 6C, after the polygon minor 403 deflects the laser beam illustrated with the solid-line, the fθ lens 404 condenses the laser beam to focus it on the semiconductor film 407.

When the polygon mirror 403 is rotated in the order of FIGS. 6A, 6B, and 6C, the angle of a reflecting plane 411 of the polygon minor 403 changes to deflect the laser beam in a direction indicated by a white arrow. With the deflection of the laser beam, a region on which the laser beam is focused, which is the beam spot, is moved in the uniaxial direction. When the polygon minor 403 is rotated, the laser beam is deflected by the next reflecting plane adjacent to the reflecting plane 411, and therefore, the beam spot can be scanned repeatedly in the same direction.

Since a part of the semiconductor film 407 within the quasi-linear beam spot 410 needs not to be completely solidified, it is necessary to scan the beam spot in the uniaxial direction at the speed satisfying the above condition. In the case of the laser irradiation apparatus shown in FIG. 5, the scanning speed of the beam spot in the uniaxial direction can be controlled by the frequency of rotating the polygon minor 403. Moreover, the length of the quasi-linear beam spot 410 in its major-axis direction can be controlled by the width of the reflecting plane 411 of the polygon mirror 403 in its rotating direction.

Furthermore, in the laser irradiation apparatus shown in FIG. 5, the quasi-linear beam spot 410 can be scanned in a direction perpendicular to the uniaxial direction (a direction perpendicular to the major axis of the quasi-linear beam spot) by the X-axis direction position controlling means 408 which can move the position of the stage 405 in the X-axis direction. The X-axis direction position controlling means 408 moves the stage 405 much more slowly in the X-axis direction than in the uniaxial direction where the laser beam is scanned. By such an operation, the scanning shown in FIG. 4C can be achieved. The X-axis direction position controlling means 408 moves the stage 405 at the constant speed in the direction perpendicular to the major axis of the quasi-linear beam spot. Thus, the crystal having the large grain size can be formed. Moreover, by moving the stage in the X-axis direction even while forming the quasi-linear beam spot, the scanning shown in FIGS. 12B and 12C are achieved. The laser irradiation apparatus shown in FIG. 5 has the Y-axis direction position controlling means 409 which can move the stage 405 in the Y-axis direction perpendicular to the X-axis direction.

Although the position of the quasi-linear beam spot 410 relative to the stage 405 is controlled by the X-axis direction position controlling means 408 and the Y-axis direction position controlling means 409 in FIG. 5, the present invention is not limited to this configuration. The laser irradiation apparatus of the present invention may have at least the X-axis direction position controlling means 408. In addition to the X-axis direction position controlling means 408, a position controlling means which can control the stage 405 in the plane including the stage 405 may be provided.

When the whole surface of the semiconductor film 407 is irradiated with the laser beam, the laser irradiation may be performed in the following way. After scanning the quasi-linear beam spot 410 in the X-axis direction by the X-axis direction position controlling means 408, the quasi-linear beam spot 410 is scanned in its major-axis direction by the Y-axis direction position controlling means 409, and this operation is performed repeatedly. The position of the quasi-linear beam spot 410 relative to the stage 405 may be controlled by moving the optical system itself. In such a case, the stage does not need to be moved, and the optical systems denoted with reference numerals 401 to 405 may be moved in both X-axis direction and Y-axis direction.

When the laser oscillator 401 is a pulsed laser oscillator, the length of the quasi-linear beam spot 410 in its major-axis direction is limited by the repetition frequency of the pulsed laser oscillator. Therefore, it is necessary to design the quasi-linear beam spot 410 in consideration of the repetition frequency of the pulse oscillation. Specifically, in the same way as the embodiment mode 1 the repetition frequency of the pulse oscillation may satisfy the inequality 1 described above.

In the inequality 1 f is the frequency of the rotation of the polygon mirror in this embodiment mode though f is the frequency of the deflection of the acousto-optic element 204 in the embodiment mode 1.

The laser irradiation apparatus shown in FIG. 5 does not always require the condensing optical system 402. However, with the condensing optical system 402, the quasi-linear beam spot 410 can have shorter width in the minor-axis direction and longer width in the major-axis direction, and the throughput can be increased accordingly. The optical system such as a mirror which can change the optical path of the laser beam is not always necessary, and it may be provided appropriately as needed. Moreover, the fθ lens 404 is not always necessary. However, by using the fθ lens 404, the speed and the size of the beam spot scanned in a uniaxial direction in the quasi-linear beam spot 410 can be made constant.

The optical system used in the laser irradiation apparatus of the present invention is not limited to that shown in FIG. 5, and a designer can add other optical system appropriately as needed.

The present embodiment mode can be freely combined with the embodiment mode 1 or 2 within the possible range.
[Embodiment Mode 4]

The embodiment modes 1 to 3 have described the example in which the laser irradiation is performed to the irradiation object two-dimensionally by scanning the laser beam along a straight line with the use of the optical system and moving the stage in a direction perpendicular to the scanning direction of the laser beam. This embodiment mode describes an example in which the laser irradiation is performed to the irradiation object two-dimensionally only by the optical system without using the means for moving the stage.

Figure 13:
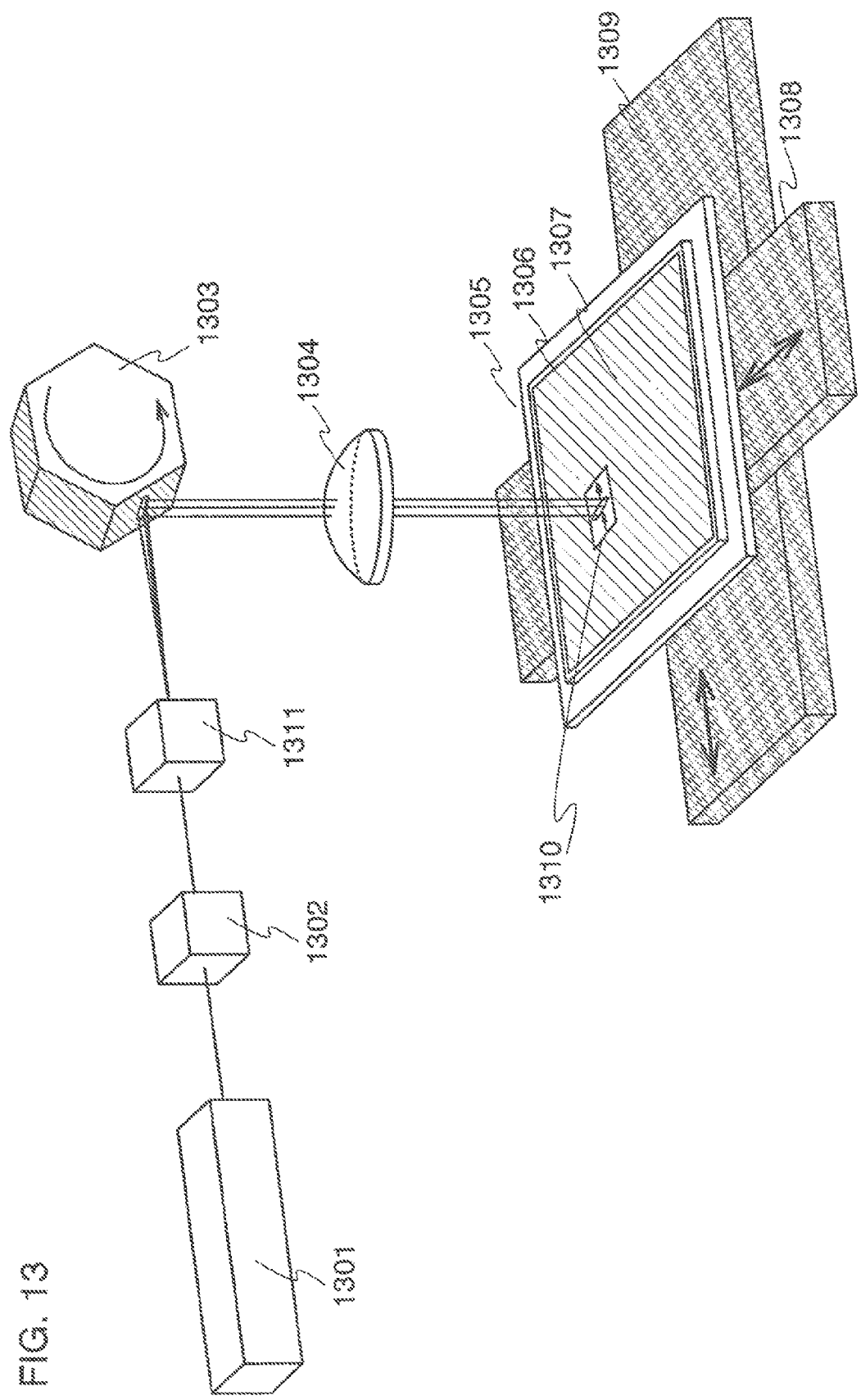
FIG. 13 is a drawing for showing an example of a laser irradiation apparatus of the present invention.

FIG. 13 shows a laser irradiation apparatus of this embodiment mode. The laser irradiation apparatus includes a laser oscillator 1301, a condensing optical system 1302, a first deflecting optical system 1311, a second deflecting optical system 1303, and an fθ lens 1304. Each of the first and second deflecting optical systems may be any optical system when it can scan the laser beam repeatedly in the uniaxial direction at high frequency. For example, a polygon mirror, a resonant scanner, or an acousto-optic element may be used. In FIG. 13, the first deflecting optical system 1311 is the acousto-optic element, and the second deflecting optical system 1303 is the polygon mirror. A reference numeral 1305 denotes a stage, and a substrate 1306 with a semiconductor film 1307 formed thereover can be mounted over the stage 1305.

The laser beam can be scanned in the uniaxial direction and the direction perpendicular to the uniaxial direction by using the first and second deflecting optical systems 1311 and 1303 in combination. First, the laser beam is scanned in the uniaxial direction by the first deflecting optical system. The second deflecting optical system 1303 is provided so as to deflect the laser beam, which has been already deflected by the first deflecting optical system 1311, further in the direction perpendicular to the uniaxial direction. The beam spot 1310 farmed thus is larger than the quasi-linear beam spot formed by only one deflecting optical system.

When the laser beam is scanned by a width of M in the uniaxial direction with the first deflecting optical system and by a width of N in the direction perpendicular to the uniaxial direction with the second deflecting optical system, the rectangular beam spot 1310 having the sides with lengths of M and N can be formed.

Figure 14A:
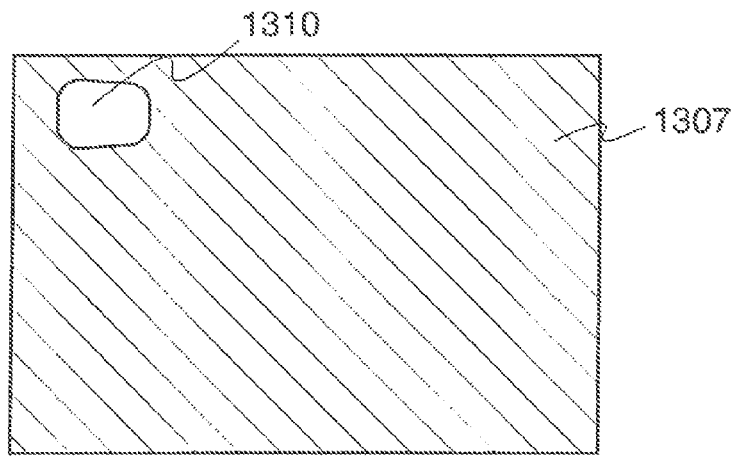
FIGS. 14A to 14E are drawings for showing the step of forming a quasi-linear beam spot by scanning the beam spot in a uniaxial direction.
Figure 14B:
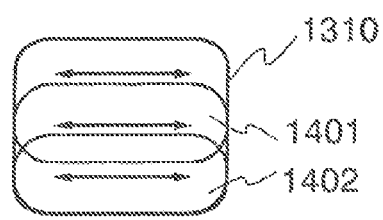
Figure 14C:
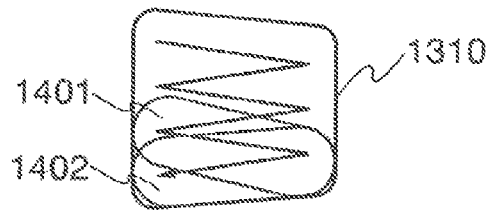
Figure 14D:
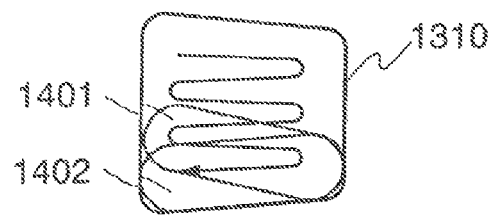
Figure 14E:
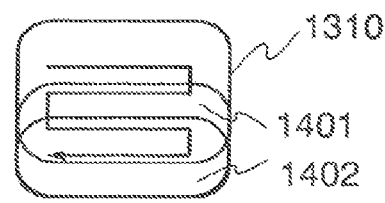

Various scanning methods are possible to form the beam spot 1310. FIG. 14A is a top view for showing the beam spot 1310 formed on the semiconductor film 1307. Each of FIGS. 14B to 14E shows an example of a scanning method of the laser beam to form the beam spot 1310. These scanning methods are the same as those shown in the embodiment modes 1 to 3. The laser beam is scanned along plural straight lines arranging at uniform intervals in FIG. 14B, along a saw-like line or a zigzag line in FIG. 14C, along a wave-like line in MG. 14D, and along a comb-like line in FIG. 14E. In this embodiment mode, the laser beam is scanned two-dimensionally by using the first and second deflecting optical systems in combination. By controlling these two deflecting optical systems appropriately, the laser beam can be scanned in various ways in addition to those shown in FIGS. 14B to 14E. The quasi-linear beam spot 1401 and the next quasi-linear beam spot 1402 are formed in the same way as the embodiment modes 1 and 2. Specifically, the quasi-linear beam spots 1401 and 1402 partially overlap, and the quasi-linear beam spot 1402 is formed before a part of the irradiation object irradiated with the quasi-linear beam spot 1401 is solidified. Thus, the crystal can be grown in the direction perpendicular to the major axis of the quasi-linear beam spot in the beam spot 1310, and the crystal having the large grain size can be obtained.

When one of the first and second deflecting optical systems is used, only a part of the semiconductor film 1307 can be crystallized. Therefore, an X-axis direction position controlling means 1308 and a Y-axis direction position controlling means 1309 may be used to move the irradiation object so as to crystallize the whole surface of the semiconductor film. Alternatively, the optical systems denoted with reference numerals 1301 to 1304 and 1311 may be moved instead of the irradiation object to irradiate the whole surface of the semiconductor film.

In this embodiment mode, a part of the semiconductor film within the range of the beam spot 1310 can be crystallized surely without using the X-axis and Y-axis direction position controlling means. Moreover, a crystalline semiconductor film in which the crystal grain is grown in one direction can be obtained. Therefore, this embodiment mode is suitable for the manufacturing method in which after forming a plurality of semiconductor elements over a substrate, they are divided into individual semiconductor elements with which plural ID chips are manufactured.

The laser irradiation apparatus shown in FIG. 13 does not always require the condensing optical system 1302. However, since the condensing optical system 1302 can suppress the divergence of the cross section of the laser beam incident into the first deflecting optical system 1311, the first deflecting optical system 1311 can be made smaller. Moreover, the fθ lens 1304 is not always necessary. However, by using the fθ lens 1304, the speed or the size of the laser beam scanned within the beam spot 1310 can be made constant.

The optical system used in the laser irradiation apparatus of the present invention is not limited to that shown in FIG. 13, and a designer can add an appropriate optical system as needed.

This embodiment mode may be freely combined with any one of the embodiment modes 1 to 3.

[Embodiment 1]

Next, a method for manufacturing a semiconductor device of the present invention is described with reference to FIGS. 7A to 7C.

As shown in FIG. 7A, a base film 501 is formed over a substrate 500. The substrate 500 may be, for example, a glass substrate such as a barium borosilicate glass or an alumino borosilicate glass, a quartz substrate, a stainless substrate, or the like. In addition, although a substrate made of flexible synthetic resin such as acrylic or plastic typified by PET, PES, PEN, or the like tends to be inferior to the above substrates in point of the resistance against the heat, the substrate made of flexible synthetic resin can be used when it can resist the heat generated in the manufacturing process.

The base film 501 is provided in order to prevent alkali-earth metal or alkali metal such as Na included in the substrate 500 from diffusing into the semiconductor film. The alkali-earth metal or the alkali metal causes an adverse effect on the characteristic of the semiconductor element when it is in the semiconductor. Therefore, the base film is formed of an insulating material such as silicon oxide, silicon nitride, or silicon nitride oxide, which can suppress the diffusion of the alkali-earth metal and alkali metal into the semiconductor film. In the present embodiment, a silicon nitride oxide film is formed in thickness from 10 to 400 nm (preferably from 50 to 300 nm) by a plasma CVD method.

It is noted that the base film 501 may be a single insulating film or may be multilayers of insulating films. In the case of using the substrate including the alkali metal or the alkali-earth metal in any way such as the glass substrate, a SUS substrate, or the plastic substrate, it is effective to provide the base film in terms of preventing the diffusion of the impurity. When the substrate such as a quartz substrate is used which hardly diffuses the impurity, the base film is not always necessary to be provided.

Next, a semiconductor film 502 is formed over the base film 501 in thickness from 25 to 100 nm (preferably from 30 to 60 nm). The semiconductor film 502 may be an amorphous semiconductor or a poly-crystalline semiconductor. When the semiconductor film 502 is the poly-crystalline semiconductor film, the poly-crystalline semiconductor film can be recrystallized by the laser irradiation of the present invention and a crystalline semiconductor film having a large crystal grain can be obtained. Moreover, not only silicon but also silicon germanium can be used as the semiconductor. When silicon germanium is used, it is preferable that the density of germanium is in the range of approximately 0.01 to 4.5 atomic %.

Next, according to the present invention, the semiconductor film 502 is crystallized by the laser irradiation as shown in FIG. 713.

Before the laser crystallization, it is desirable to perform heat treatment to the semiconductor film at 550° C. for four hours in order to increase the resistance of the semiconductor film 502 against the laser beam. At the laser crystallization, the continuous wave laser oscillator or the pulsed laser oscillator having the repetition frequency of 100 MHz or more can be used.

Specifically, a known continuous wave gas or solid-state laser can be used. The gas laser may be, for example, an Ar laser or Kr laser. The solid-state laser may be, for example, a YAG laser, a $YVO_4$ laser, a YLF laser, a $YAlO_3$ laser, a $Y_2O_3$ laser, a glass laser, a ruby laser, an alexandrite laser, or a Ti: Sapphire laser.

The pulse laser having the repetition frequency of 100 MHz or more may be, for example, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, or a gold vapor laser.

The crystal having the large grain size can be obtained by, for example, using the second, third, or fourth harmonic of the continuous wave solid-state laser. Typically, it is desirable to use the second harmonic (532 nm) or the third harmonic (355 nm) of the fundamental wave (1064 nm) emitted from the YAG laser. Specifically, the laser beam emitted from the continuous wave YAG laser is converted into the harmonic with a power of 4 to 8 W by a non-linear optical element. Then, the quasi-linear beam spot is formed by scanning the beam spot in the uniaxial direction and moved on the semiconductor film 502. The energy density may be set in the range of 0.01 to 100 MW/cm$^2$ (preferably 0.1 to 10 MW/cm$^2$). The scanning speed of the laser beam for forming the quasi-linear beam spot is in the range of 1×10$^6$ to 1×10$^7$ cm/s. In this embodiment, it is set to 2×10$^6$ cm/s. The scanning speed of the quasi-linear beam spot in the direction perpendicular to its major axis is set in the range of 10 to 2000 cm/s. In this embodiment, the crystallization is performed under the condition where the energy is 5 W, the quasi-linear beam spot has a size of 400 μm in the major axis and 10 to 20 μm in the minor axis, and the scanning speed in the direction perpendicular to the major axis is set to 35 cm/s.

The interface between the solid phase and the liquid phase can be moved continuously by scanning the quasi-linear beam spot in the direction indicated by a white arrow as shown in FIG. 7B. Therefore, the crystal grain grown continuously in the scanning direction of the quasi-linear beam spot is formed. By forming the crystal grain of the single crystal extending long in the scanning direction, it is possible to form the TFT having almost no crystal grain boundaries which intersect the direction where the carrier moves.

The laser irradiation may be performed in the inert atmosphere such as noble gas or nitrogen. This can suppress the roughness of the surface of the semiconductor due to the laser irradiation and suppress the variation of the threshold voltage due to the variation of the interface state density.

A semiconductor film 503 in which the crystallinity is further enhanced can be formed by irradiating the semiconductor film 502 with the laser beam.

Next, as shown in FIG. 7C, the semiconductor film 503 is patterned to form island-shaped semiconductor films 507 to 509, and various semiconductor elements typified by a TFT are formed by using these island-shaped semiconductor films 507 to 509.

When the TFT is manufactured for example, a gate insulating film (not shown) is formed so as to cover the island-shaped semiconductor films 507 to 509. The gate insulating film may be formed with, for example, a silicon oxide, silicon nitride, or silicon nitride oxide by the plasma CVD method or the sputtering method.

Next, a gate electrode is formed by forming a conductive film over the gate insulating film and pattering the conductive film. Then, a source region, a drain region, an LDD region, and the like are formed by adding an impurity imparting p-type or n-type conductivity to the island-shaped semiconductor films 507 to 509 by using the gate electrode or the patterned resist as the mask.

The TFT can be formed by the above processes. The method for manufacturing the semiconductor device of the present invention is not limited to the manufacturing method of the described above. The variation of the mobility, the threshold voltage, and the on-current between the TFTs can be suppressed when the semiconductor film crystallized by the present invention is used as the active layer of the TFT.

Moreover, a crystallization step using a catalyst element may be provided before the laser crystallization step. The catalyst element may be, for example, nickel (Ni), germanium (Ge), iron (Fe), palladium (Pd), tin (Sn), lead (Pb), cobalt (Co), platinum (Pt), copper (Cu), or gold (Au). When the crystallization step by the laser beam is performed after the crystallization step using a catalyst element, the laser irradiation melts an upper part of the semiconductor film but does not melt a lower part of the semiconductor film. Therefore, a crystal remained without being melted in the lower part of the semiconductor film becomes a crystal nucleus, and the crystallization is promoted from the lower part toward the upper part of the semiconductor film. As a result, the crystallization by the irradiation of the laser beam is promoted uniformly from the side of the substrate to the surface of the semiconductor film and the crystallinity of the semiconductor film is further promoted compared with the case that the crystallization is performed only by the laser beam. Therefore, the roughness of the surface of the semiconductor film after the laser crystallization can be suppressed. Consequently, the variation of the characteristic between the semiconductor elements formed afterward, typically the TFT, can be suppressed further, and the off-current can be suppressed.

It is noted that the crystallization may be performed in such a way that the heat treatment is performed after the catalyst element is added in order to promote the crystallization and that the laser irradiation is performed in order to enhance the crystallinity further. Alternatively, the heat treatment may be omitted. Specifically, after adding the catalyst element, the laser irradiation may be performed to the semiconductor film instead of the heat treatment so as to enhance the crystallinity.

Although the present embodiment has shown an example in which the laser irradiation method of the present invention is used to crystallize the semiconductor film, the laser irradiation method of the present invention may be applied to activate the impurity element doped in the semiconductor film.

The present embodiment can be freely combined with any one of the embodiment modes 1 to 4 within the possible range.

[Embodiment 2]

Unlike the embodiment 1, this embodiment describes an example in which the laser crystallization is combined with the crystallization by the catalyst element.

Initially, the process up to forming the semiconductor film 502 is performed with reference to FIG. 7A of the embodiment 1. Next, as shown in FIG. 8A, a nickel acetate solution including Ni in the range of 1 to 100 ppm in weight is applied to the surface of the semiconductor film 502 by a spin coating method. It is noted that the catalyst may be added not only by the above method but also by another method such as a sputtering method, an evaporation method, or a plasma process. Next, the heat treatment is performed for 4 to 24 hours at temperatures ranging from 500 to 650° C., for example for 14, hours at 570° C. This beat treatment forms a semiconductor film 520 in which the crystallization is promoted in the vertical direction from the surface with the nickel acetate solution applied thereon toward the substrate 500 (FIG. 8A).

The heat treatment is performed for example at a set temperature of 740° C. for 180 seconds by RTA (Rapid Thermal Anneal) using radiation of the lamp as a heat source or by RTA using heated gas (gas RTA). The set temperature is the temperature of the substrate measured by a pyrometer, and the measured temperature is herein defined as the set temperature in the heat treatment. As another method, the heat treatment using an annealing furnace at a temperature of 550° C. for 4 hours may be also employed. It is the action of the metal element having the catalytic activity that lowers the temperature and shortens the time in the crystallization.

Although the present embodiment uses nickel (Ni) as the catalyst element, another element such as germanium (Ge), iron (Fe), palladium (Pd), tin (Sn), lead (Pb), cobalt (Co), platinum (Pt), copper (Cu), or gold (Au) may be also used.

Subsequently, the semiconductor film 520 is crystallized by the present invention as shown in FIG. 8B. The laser crystallization is performed under the condition described in the embodiment 1.

By the irradiation of the laser beam to the semiconductor film 520 as described above, a semiconductor film 521 in which the crystallinity is enhanced further is formed. It is considered that the semiconductor film 521 crystallized using the catalyst element includes the catalyst element (herein Ni) at the density of approximately $1\times10^{19}$ atoms/cm$^3$. Therefore, the gettering of the catalyst element existing in the semiconductor film 521 is performed next.

Initially, an oxide film 522 is formed over a surface of the semiconductor film 521 as shown in FIG. 8C. By forming the oxide film 522 in thickness from approximately 1 to 10 nm, it is possible to prevent the surface of the semiconductor film 521 from becoming rough in the following etching process. The oxide film 522 can be formed by a known method. For example, the oxide film 522 may be formed by oxidizing the surface of the semiconductor film 521 using ozone water or using the solution in which hydrogen peroxide solution is mixed with sulfuric acid, hydrochloric acid, nitric acid, or the like. Alternatively, the oxide film 522 may be formed by the plasma process, heat treatment, or ultraviolet ray irradiation in the atmosphere including oxygen. Moreover, the oxide film 522 may be formed separately by the plasma-CVD method, the sputtering method, the evaporation method, or the like.

A semiconductor film 523 for the gettering including the noble gas element at the density of $1\times10^{20}$ atoms/cm$^3$ or more is formed in thickness from 25 to 250 nm over the oxide film 522 by the sputtering method. It is desirable that the mass density of the semiconductor film 523 for the gettering is lower than that of the semiconductor film 521 in order to increase the selecting ratio to the semiconductor film 521 when being etched. As the noble gas element, one or a plurality of elements selected from the group consisting of helium (He), neon (Ne), argon (Ar), krypton (Kr), and xenon (Xe) are used.

Next, the gettering is performed by the heat treatment according to the furnace annealing method or the RTA method. When the furnace annealing method is employed, the heat treatment is performed for 0.5 to 12 hours at temperatures from 450 to 600° C. in the atmosphere of nitrogen. When the RTA method is employed, a lamp light source for heating is turned on for 1 to 60 seconds, preferably from 30 to 60 seconds, which is repeated from 1 to 10 times, preferably from 2 to 6 times. The luminance intensity of the lamp light source is set so that the semiconductor film is heated instantaneously at temperatures ranging from 600 to 1000° C., preferably from approximately 700 to 750° C.

Through the heat treatment, the catalyst element inside the semiconductor film 521 is moved to the semiconductor film 523 for the gettering due to the diffusion as indicated by an arrow, and the catalyst element is thus gettered.

Next, the semiconductor film 523 for the gettering is removed by etching selectively. The etching process is performed by dry etching using ClF$_3$ not applying plasma or by wet etching using an alkali solution such as the solution including hydrazine or tetramethylammonium hydroxide (chemical formula (CH$_3$)$_4$NOH). On this occasion, the oxide film 522 can prevent the semiconductor film 521 from being etched.

Next, after removing the oxide film 522 by hydrofluoric acid, the semiconductor film 521 is patterned to form island-shaped semiconductor films 524 to 526 (FIG. 8I)). Various semiconductor elements, typically TFT, can be formed using these island-shaped semiconductor films 524 to 526. It is noted that the gettering method is not limited to that shown in this embodiment. Another method may be also employed to decrease the catalyst element in the semiconductor film.

In this embodiment, the laser irradiation melts an upper part of the semiconductor film but does not melt a lower part of the semiconductor film. Therefore, a crystal remained without being melted in the lower part of the semiconductor film becomes a crystal nucleus, and the crystallization is promoted from the lower part toward the upper part of the semiconductor film. As a result, the crystallization by the irradiation of the laser beam is promoted uniformly from the side of the substrate to the surface of the semiconductor film, and the crystal orientation is easily aligned. Therefore, the surface is prevented from becoming rough compared with the case of the embodiment 1. Moreover, the variation of the characteristic between the semiconductor elements formed afterward, typically TFT, can be suppressed further.

This embodiment has described the process to promote crystallization by performing the heat treatment after the catalyst element is added and to enhance crystallinity further by irradiating with the laser beam. However, the present invention is not limited to this, and the heat treatment may be omitted. Specifically, after adding the catalyst element, the laser irradiation may be performed instead of the heat treatment in order to enhance the crystallinity.

This embodiment can be freely combined with any one of the embodiment modes 1 to 4 and the embodiment 1 within possible range.

[Embodiment 3]

This embodiment describes another example in which the crystallization method of the present invention is combined with the crystallization method by the catalyst element.

Initially, the process up to forming the semiconductor film 502 is performed with reference to FIG. 7A of the embodiment 1. Next, a mask 540 having an opening is formed over the semiconductor film 502. Then, a nickel acetate solution including Ni in the range of 1 to 100 ppm in weight is applied to the surface of the semiconductor film 502. The catalyst element may be applied not only by the above method but also by the sputtering method, the evaporation method, the plasma process, or the like. The nickel acetate solution contacts the semiconductor film 502 in the opening of the mask 540 (FIG. 9A).

Next, a heat treatment is performed for 4 to 24 hours at temperatures from 500 to 650° C., for example for 14 hours at a temperature of 570° C. This heat treatment forms a semiconductor film 530 in which the crystallization is promoted from the surface with the nickel acetate solution applied thereon as indicated by a solid-line arrow (FIG. 9A). The heat treatment may be performed not only by the above method but also by another method such as the method shown in the embodiment 2. As the catalyst element, elements recited in the embodiment 2 can be used.

After removing the mask 540, the semiconductor film 530 is crystallized by the laser irradiation apparatus of the present invention as shown in FIG. 9B. The laser crystallization can be performed under the condition described in the embodiment 1. By this laser irradiation to the semiconductor film 530, a semiconductor film 531 in which the crystallinity is further enhanced is formed.

It is considered that the semiconductor film 531 crystallized using the catalyst element includes the catalyst element (herein Ni) at the density of approximately $1\times10^{19}$ atoms/cm$^3$. Therefore, the gettering of the catalyst element existing in the semiconductor film 531 is performed next.

Initially, as shown in FIG. 9C, a silicon oxide film 532 for the mask is formed in 150 nm thick so as to cover the semiconductor film 531. Then, the silicon oxide film 532 is patterned to faun an opening so that a part of the semiconductor film 531 is exposed. Then, phosphorous is added to the exposed part of the semiconductor film 531 to form a gettering region 533 with the phosphorus added. When heat treatment is performed in this state for 5 to 24 hours in the nitrogenous atmosphere of 550 to 800° C., for example for 12 hours at a temperature of 600° C., the gettering region 533 with the phosphorus added works as a gettering site, and the catalyst element left in the semiconductor film 531 moves to the gettering site 533 with the phosphorous added.

By etching away the gettering region 533 with the phosphorous added, the density of the catalyst element can be lowered to be $1 \times 10^{17}$ atoms/cm$^3$ or less in the rest of the semiconductor film 531. Next, after removing the silicon oxide film 532 for the mask, the semiconductor film 531 is patterned to form island-shaped semiconductor films 534 to 536 (FIG. 9D). These island-shaped semiconductor films 534 to 536 can be used to form various semiconductor elements typified by a TFT. The gettering method is not limited to that shown in this embodiment. Another method may be also employed to decrease the catalyst element in the semiconductor film.

In this embodiment, the laser irradiation melts an upper part of the semiconductor film but does not melt a lower part of the semiconductor film. Therefore, a crystal remained without being melted in the lower part of the semiconductor film becomes a crystal nucleus, and the crystallization is promoted from the lower part toward the upper part of the semiconductor film. As a result, the crystallization by the irradiation of the laser beam is promoted uniformly from the side of the substrate to the surface of the semiconductor film, and the crystal orientation is easily aligned. Therefore, the surface is prevented from becoming rough compared with the case of the embodiment 1. Moreover, the variation of the characteristic between the semiconductor elements formed afterward, typically the TFT, can be suppressed further.

This embodiment can be freely combined with any one of the embodiment modes 1 to 4 and the embodiments 1 and 2 within possible range.

[Embodiment 4]

Figure 10:
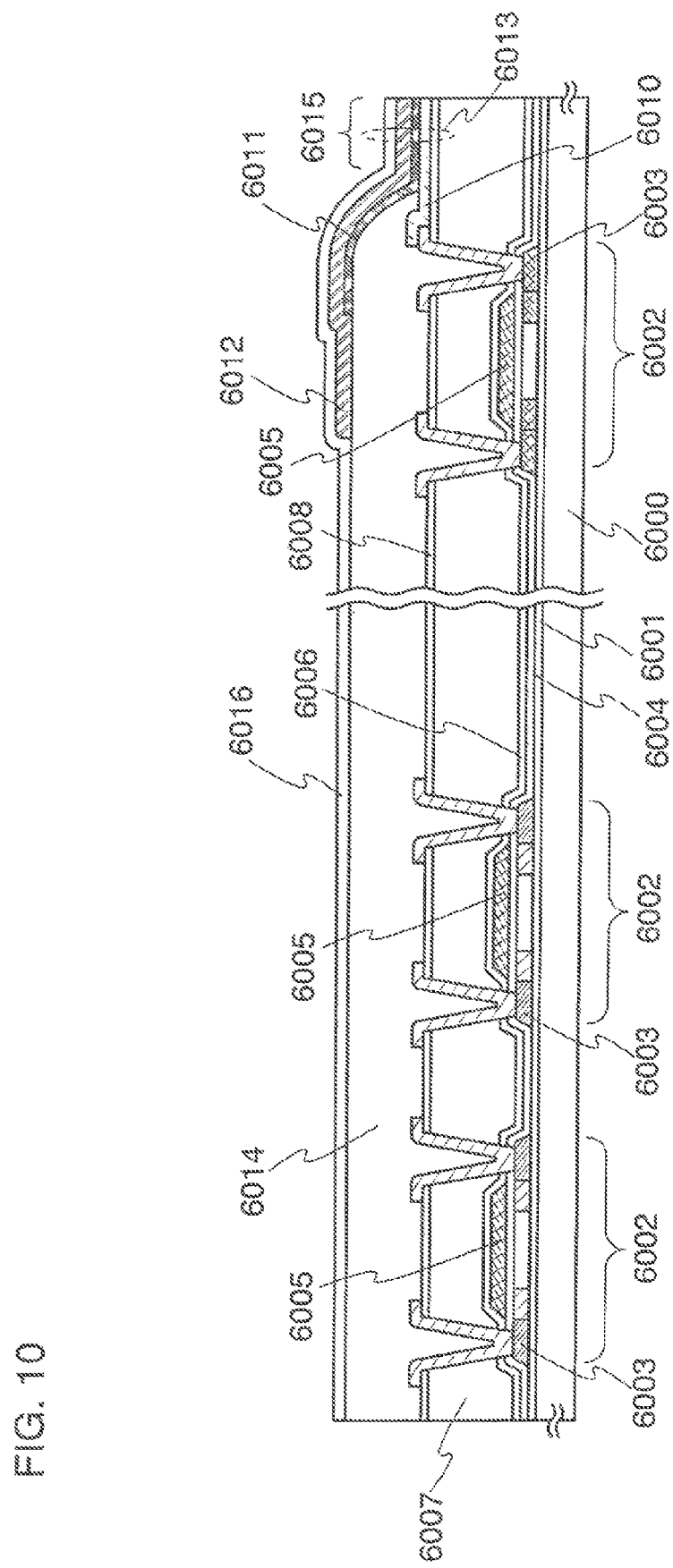
FIG. 10 is a drawing for showing a configuration of the pixel in a light-emitting device, which is one of semiconductor devices formed by the laser irradiation apparatus of the present invention.

With reference to FIG. 10, this embodiment describes a pixel structure of a light-emitting device, which is one of semiconductor display devices that can be manufactured using the laser irradiation apparatus.

In FIG. 10, a base film 6001 is formed over a substrate 6000, and a transistor 6002 is formed over the base film 6001. The transistor 6002 has an island-shaped semiconductor film 6003, a gate electrode 6005, and a gate insulating film 6004 sandwiched between the island-shaped semiconductor film 6003 and the gate electrode 6005.

The island-shaped semiconductor film 6003 is formed with a poly-crystalline semiconductor film that is crystallized by applying the present invention. The island-shaped semiconductor film may be formed with not only silicon but also silicon germanium. When the silicon germanium is used, it is preferable that the density of the germanium is in the range of approximately 0.01 to 4.5 atomic %. Moreover, silicon with carbon nitride added may be used.

As the gate insulating film 6004, silicon oxide, silicon nitride, or silicon oxynitride can be used. Moreover, the gate insulating film 6004 may be formed by laminating these materials. For example, a film in which SiN is formed on SiO$_2$ may be used as the gate insulating film 6004. The gate electrode 6005 is formed with an element selected from the group consisting of Ta, W, Ti, Mo, Al, and Cu; or an alloy material or a chemical compound material including the above element. Furthermore, a semiconductor film typified by a poly-crystalline silicon film with an impurity element such as phosphorus doped may be used. Not only a single conductive film but also a conductive film including a plurality of layers may be used as the gate electrode 6005.

The transistor 6002 is covered with a first interlayer insulating film 6006. A second interlayer insulating film 6007 and a third interlayer insulating film 6008 are formed over the first interlayer insulating film 6006. The first interlayer insulating film 6006 can be formed with a single layer of silicon oxide, silicon nitride, or silicon oxynitride or formed by laminating the above materials by the plasma CVD method or the sputtering method.

The second interlayer insulating film 6007 can be formed with an organic resin film, an inorganic insulating film, a siloxane resin, or the like. Note that the siloxane-based resin is defined as resin containing Si—O—Si bond. The siloxane-based resin includes an organic group at least containing hydrogen (for example, an alkyl group or aromatic hydrocarbon) as a substituent. Alternatively, a fluoro group may also be included as the substituent. Furthermore, an organic group at least containing hydrogen and a fluoro group may also be included as the substituent. In this embodiment, non-photosensitive acrylic is used. The third interlayer insulating film 6008 is formed of a film that is hard to transmit the material causing to promote deterioration of the light-emitting element such as moisture, oxygen, and the like compared with another insulating film. Typically, it is preferable to use a DLC film, a carbon nitride film, a silicon nitride film formed by the RF sputtering method, or the like.

In FIG. 10, a reference numeral 6010 denotes a first electrode, a reference numeral 6011 denotes an electroluminescent layer, a reference numeral 6012 denotes a second electrode, and the part in which the first electrode 6010, the electroluminescent layer 6011, and the cathode 6012 are overlapped corresponds to a light-emitting element 6013. One of the transistors 6002 is a driver transistor for controlling the current supplied to the light-emitting element 6013, and it is connected directly or serially through another circuit element to the light-emitting element 6013. The electroluminescent layer 6011 is a single light-emitting layer or multilayers including the light-emitting layer.

The first electrode 6010 is formed over the third interlayer insulating film 6008. An organic resin film 6014 is formed as the partition wall on the third interlayer insulating film 6008. Although the present embodiment uses the organic resin film as the partition wall, an inorganic insulating film, a siloxane resin, or the like can be also used as the partition wall. The organic resin film 6014 has an opening 6015, and the light-emitting element 6013 is formed by overlapping the first electrode 6010, the electroluminescent layer 6011, and the second electrode 6012 in the opening 6015.

A protective film 6016 is formed over the organic resin film 6014 and the second electrode 6012. Like the third interlayer insulating film 6008, the protective film 6016 is the film that is hard to transmit the material causing to promote deterioration of the light-emitting element such as moisture and oxygen. For example, a DLC film, a carbon nitride film, a silicon nitride film formed by the RF sputtering method, or the like is used as the protective film 6016.

It is preferable to make the edge portion of the opening 6015 of the organic resin film 6014 round so as to prevent the electroluminescent layer 6011 partially overlapping the organic resin film 6014 from staving. More specifically, it is desirable that the sectional surface of the organic resin film at the edge of the opening has a radius of curvature ranging from approximately 0.2 to 2 μm. With the above structure, the coverage of the electroluminescent layer and the second electrode to be formed afterward can be improved, and it is possible to prevent the electroluminescent layer 6011 from shorting in the holes formed in the first electrode 6010 and the second electrode 6012. Moreover, when the stress of the electroluminescent layer 6011 is relaxed, it is possible to decrease the defect called shrink in which the light-emitting region decreases and to enhance the reliability.

FIG. 10 shows an example of using positive photosensitive acrylic resin as the organic resin film 6014. The photosensitive organic resin includes the positive type in which the region where the energy such as light, electron, or ion is exposed is removed and the negative type in which the region that is exposed is not removed. The present invention may use the negative organic resin film. Moreover, a photosensitive polyimide may be used to form the organic resin film 6014. In the case of forming the organic resin film 6014 using the negative acrylic, the edge portion of the opening 6015 shapes like a letter of S. On this occasion, it is desirable that the radius of curvature in the upper portion and the lower portion of the opening is in the range of 0.2 to 2 μm.

It is noted that one of the first electrode 6010 and the second electrode 6012 is an anode and the other is a cathode.

The anode can be formed with a light-transmitting conductive oxide material such as indium tin oxide (ITO), zinc oxide (ZnO), indium zinc oxide (IZO), gallium-doped zinc oxide (GZO), or the like. Moreover, indium tin oxide including ITO and silicon oxide (hereinafter referred to as ITSO), or indium oxide including silicon oxide in which zinc oxide (ZnO) is added in the range of 2 to 20% may be used. Furthermore, the anode may be formed with a single layer including one or a plurality of elements selected from the group consisting of TiN, ZrN, Ti, W, Ni, Pt, Cr, Ag, Al, and the like; two layers formed by laminating a film mainly including titanium nitride and a film mainly including aluminum; three layers formed by laminating a titanium nitride film, a film mainly including aluminum, and a titanium nitride film; or the like. When the anode is formed of a material different from the light-transmitting conductive oxide material and when the light is emitted from the anode side, the anode is formed in a thickness of such a degree that the light can transmit (preferably from approximately 5 to 30 nm).

The cathode can be formed with metal, an alloy, a conductive compound, or a mixture of these materials each having low work function. Specifically, the cathode can be formed with an alkali metal such as Li or Cs; an alkali-earth metal such as Mg, Ca, or Sr; an alloy including these such as Mg:Ag, Al:Li, or Mg:In; a chemical compound of these such as $CaF_2$ or CaN; or a rare-earth metal such as Yb or Er. When an electron-injecting layer is provided in the electroluminescent layer 6011, a conductive layer such as Al can be used. When the light is emitted from the cathode side, the cathode may be formed with a light-transmitting conductive oxide material such as the indium tin oxide (ITO), zinc oxide (ZnO), indium zinc oxide (IZO), gallium-doped zinc oxide (GZO), or the like. Moreover, the cathode may be formed with indium tin oxide including ITO and silicon oxide (hereinafter referred to as ITSO), or indium oxide including silicon oxide in which zinc oxide (ZnO) is further mixed in the range of 2 to 20%. In the case of using the light-transmitting conductive oxide material, the electron-injecting layer is preferably provided to the electroluminescent layer 6011 to be formed afterward. By forming the cathode in the thickness of such a degree that the light can transmit (preferably from approximately 5 to 30 nm), the light can be taken from the cathode side. In this case, the sheet resistance of the cathode may be suppressed by forming the light-transmitting conductive film with the light-transmitting conductive oxide material so as to contact the upper part or the lower part of the cathode.

Although FIG. 10 shows the structure in which the light emitted from the light-emitting element is delivered to the side of the substrate 6000, the light-emitting element may have a structure in which the light is delivered to the side opposite to it.

It is noted that after the light-emitting device shown in FIG. 10 is obtained, it is preferable to package (enclose) the light-emitting device with a protective film (a film including a layer which can melt when applying heat and pressure, ultraviolet curable resin film, or the like) or a light-transmitting cover member that is highly airtight and hardly degases. The reliability of the light-emitting element is enhanced when the inside of the cover member is filled with the inert atmosphere or the material having moisture-absorption characteristic (barium oxide, for example) is set in the cover member.

Although the present embodiment shows the light-emitting device as an example of the semiconductor display device, the semiconductor device formed by the manufacturing method of the present invention is not limited to this.

This embodiment can be freely combined with any one of the embodiment modes 1 to 4 and the embodiments 1 to 3 within possible range.

This application is based on Japanese Patent Application serial no. 2004-127468 filed in Japan Patent Office on Apr. 23, 2004, the contents of which are hereby incorporated by reference.

What is claimed is:

1. A method of manufacturing a semiconductor device comprising:
    crystallizing a semiconductor film by irradiating the semiconductor film with a laser beam;
    wherein the semiconductor film is scanned with the laser beam along a wave-like line or a saw-like line;
    wherein when the laser beam is scanned along the wave-like line or the saw-like line from a first direction-turning point to a third direction-turning point through a second direction-turning point, a first beam spot centering on the first direction-turning point partly overlaps a second beam spot centering on the third direction-turning point;
    wherein the second beam spot is formed by scanning the laser beam before the semiconductor film irradiated with the first beam spot is completely solidified, and
    wherein the laser beam is scanned from the first direction turning point to the third direction turning point within 100 ns.

2. The method of manufacturing a semiconductor device according to claim 1,
    wherein the laser beam is emitted from a continuous wave laser oscillator.

3. The method of manufacturing a semiconductor device according to claim 1,
    wherein the laser beam is emitted from a pulsed laser oscillator with a repetition rate of 100 MHz or more.

4. The method of manufacturing a semiconductor device according to claim 1, further comprising:
    forming the semiconductor film, before crystallizing the semiconductor film, wherein the semiconductor film comprises an amorphous semiconductor or a poly-crystalline semiconductor.

5. The method of manufacturing a semiconductor device according to claim 1, wherein a scanning speed for irradiating the semiconductor film is in a range of $1 \times 10^6$ to $1 \times 10^7$ cm/s.

6. The method of manufacturing a semiconductor device according to claim 1, wherein the laser beam is scanned by an acousto-optic element.

7. The method of manufacturing a semiconductor device according to claim 1, wherein a first quasi-linear beam spot formed by scanning the laser beam between the first direction-turning point and the second direction-turning point partially overlaps with a second quasi-linear beam spot formed by scanning the laser beam between the second direction-turning point and the third direction-turning point.

* * * * *